United States Patent
Yasuda et al.

(10) Patent No.: US 9,438,243 B2
(45) Date of Patent: Sep. 6, 2016

(54) PROGRAMMABLE LOGIC CIRCUIT AND NONVOLATILE FPGA

(71) Applicant: Kabushiki Kaisha Toshiba, Tokyo (JP)

(72) Inventors: Shinichi Yasuda, Tokyo (JP); Kosuke Tatsumura, Kanagawa (JP); Mari Matsumoto, Kanagawa (JP); Koichiro Zaitsu, Kanagawa (JP); Masato Oda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/983,968

(22) Filed: Dec. 30, 2015

(65) Prior Publication Data

US 2016/0112049 A1    Apr. 21, 2016

Related U.S. Application Data

(63) Continuation of application No. 14/602,306, filed on Jan. 22, 2015, now Pat. No. 9,264,044.

(30) Foreign Application Priority Data

Jan. 27, 2014 (JP) ................................ 2014-012695

(51) Int. Cl.
*H01L 25/00* (2006.01)
*H03K 19/177* (2006.01)

(52) U.S. Cl.
CPC .... *H03K 19/17728* (2013.01); *H03K 19/1776* (2013.01)

(58) Field of Classification Search
CPC ............... H03K 19/17736; H03K 19/018585; H03K 19/0948; H03K 19/177
USPC ................. 326/37–41, 47; 365/189.011, 231
See application file for complete search history.

(56) References Cited

U.S. PATENT DOCUMENTS

| | | | |
|---|---|---|---|
| 4,758,745 A | 7/1988 | Elgamal et al. | |
| 5,341,030 A | 8/1994 | Galbraith | |
| 5,452,249 A * | 9/1995 | Miyamoto | G11C 7/02 365/154 |
| 5,537,056 A | 7/1996 | McCollum | |
| 6,667,902 B2 | 12/2003 | Peng | |
| 6,765,427 B1 | 7/2004 | McCollum | |
| 9,264,044 B2 * | 2/2016 | Yasuda | H03K 19/018585 |

(Continued)

FOREIGN PATENT DOCUMENTS

| | | |
|---|---|---|
| JP | 2003-115537 | 4/2003 |
| JP | 2005-536112 | 11/2005 |

(Continued)

*Primary Examiner* — Jason M Crawford
(74) *Attorney, Agent, or Firm* — Finnegan, Henderson, Farabrow, Garrett & Dunner LLP

(57) ABSTRACT

A programmable logic circuit includes: first to third wiring lines, the second wiring lines intersecting with the first wiring lines; and cells provided in intersecting areas, at least one of cells including a first transistor and a programmable device with a first and second terminals, the first terminal connecting to one of a source and a drain of the first transistor, the second terminal being connected to one of the second wiring lines, the other of the source and the drain being connected to one of the first wiring lines, and a gate of the first transistor being connected to one of the third wiring lines. One of source and drain of each of the first cut-off transistors is connected to the one of the second wiring lines, and an input terminal of each of first CMOS inverters is connected to the other of the source and the drain.

20 Claims, 29 Drawing Sheets

(56) References Cited

U.S. PATENT DOCUMENTS

| | | |
|---|---|---|
| 2007/0274126 A1 | 11/2007 | Kohler et al. |
| 2007/0285979 A1* | 12/2007 | Turner .................. G11C 5/005 365/174 |
| 2010/0232203 A1* | 9/2010 | Chung .................. G11C 17/16 365/96 |
| 2012/0161813 A1 | 6/2012 | Cho et al. |
| 2012/0195122 A1 | 8/2012 | Ohmaru |
| 2012/0243357 A1 | 9/2012 | Yamauchi et al. |
| 2013/0033921 A1 | 2/2013 | Tsuda et al. |
| 2013/0293266 A1 | 11/2013 | Takemura |
| 2014/0035618 A1* | 2/2014 | Tatsumura ............. G11C 15/04 326/41 |

FOREIGN PATENT DOCUMENTS

| | | |
|---|---|---|
| JP | 2007-522655 | 8/2007 |
| JP | 2012-203954 | 10/2012 |
| JP | 2012-257192 | 12/2012 |
| JP | 2013-37736 | 2/2013 |
| JP | 2013-251893 | 12/2013 |
| JP | 2015-018590 | 1/2015 |
| WO | WO 2004/015732 | 2/2004 |

* cited by examiner

PROGRAMMABLE LOGIC CIRCUIT AND NONVOLATILE FPGA

CROSS REFERENCE TO RELATED APPLICATIONS

This is a continuation of application Ser. No. 14/602,306, filed Jan. 22, 2015, which is incorporated herein by reference.

This application is based upon and claims the benefit of priority from prior Japanese Patent Application No. 2014-012695 filed on Jan. 27, 2014 in Japan, the entire contents of which are incorporated herein by reference.

FIELD

Embodiments described herein relate generally to programmable logic circuits and nonvolatile field programmable gate arrays (FPGAs).

BACKGROUND

Reconfigurable integrated circuits, notably field programmable gate arrays (FPGAs), have received attention in recent years. FPGAs realize basic logic data by means of logic blocks. Users can achieve desired logic functions by switching connections among logic blocks by means of switch blocks. Configuration memories store logic data of the logic blocks and data of the switch blocks for changing connections. Desired logic functions can be realized based on the stored data.

Nonvolatile FPGAs can be constituted by storing nonvolatile data in the configuration memories. Examples of nonvolatile FPGAs include those employing antifuse devices that are typical programmable devices. In these nonvolatile FPGAs, the switch blocks connecting the logic blocks are replaced with antifuse devices. An antifuse device, however, requires a high voltage in a write operation. This reduces the operational speed of conventional antifuse FPGAs, since signals on high voltage applied wiring lines cannot be directly amplified by low voltage driven CMOS circuits capable of operating at a high speed. If signals on high voltage applied wiring lines can be directly amplified by the low voltage driven CMOS circuits, gate insulating films of transistors in the CMOS circuits may be broken down. Nonvolatile FPGAs including antifuse devices also have a problem of not capable of employing a multiple memory architecture, in which a plurality of memories are connected to a switch and read depending on applications.

DETAILED DESCRIPTION

A programmable logic circuit according to an embodiment includes: a plurality of first wiring lines; a plurality of second wiring lines intersecting with the first wiring lines in intersecting areas; a plurality of third wiring lines; a plurality of cells provided in the intersecting areas, at least one of the cells including a first transistor with a source, a drain, and a gate, and a programmable device with a first terminal and a second terminal, the first terminal connecting to one of the source and the drain of the first transistor, the second terminal being connected to one of the second wiring lines, the other of the source and the drain of the first transistor being connected to one of the first wiring lines, and the gate of the first transistor being connected to one of the third wiring lines; a plurality of first cut-off transistors each including a source and a drain, one of the source and the drain being connected to the one of the second wiring lines; a plurality of first CMOS inverters corresponding to the first cut-off transistors, each of the first CMOS inverters including an input terminal, the input terminal being connected to the other of the source and the drain of the corresponding one of the first cut-off transistors.

Embodiments will now be explained with reference to the accompanying drawings.

(First Embodiment)

Figure 1:
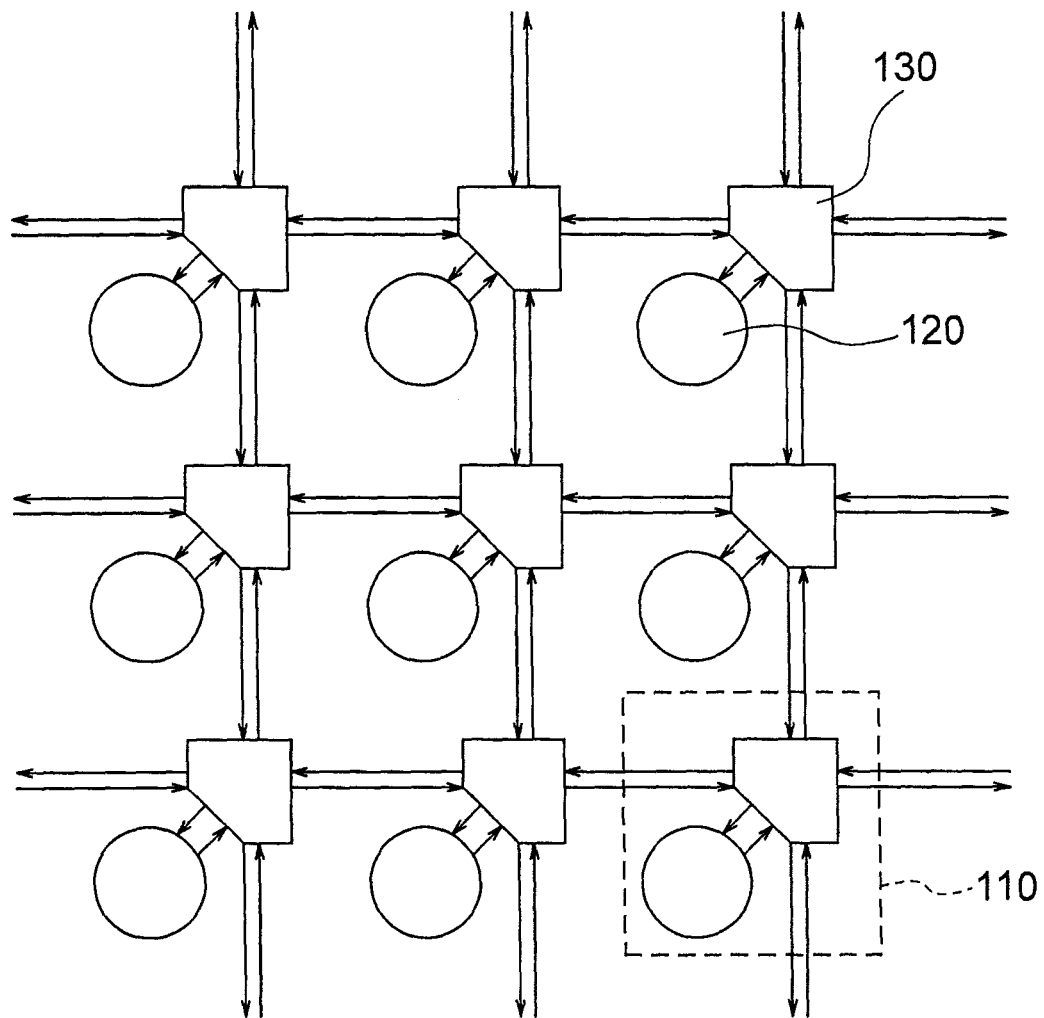
FIG. 1 is a block diagram showing a structure of a field programmable gate array (FPGA).

Before a programmable logic circuit according to a first embodiment is described, a configuration of general FPGAs will be described. As shown in FIG. 1, an FPGA 100 generally includes a plurality of basic blocks 110 arranged in an array form. Each basic block 110 is connected to adjacent basic blocks 110 with wiring lines, and includes a logic block 120 and a switch block 130. The logic block 120 performs logical operations basically using a look-up table containing a truth table. Each switch block 130 controls the connection and the disconnection of the wiring lines connecting to adjacent basic blocks 110 so that signals are transmitted to given directions. Each switch block 130 also connects to the logic block 120 included in the relevant basic block 110 including the switch block 130. The logic block 120 and the switch block 130 are capable of controlling the connection based on data stored in a configuration memory of the programmable logic circuit.

Figure 2:
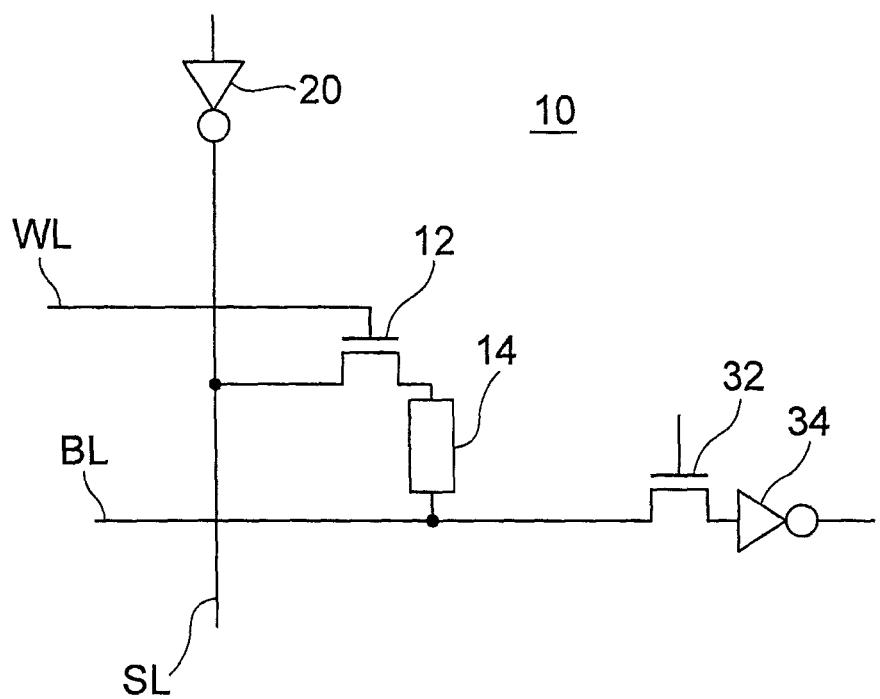
FIG. 2 is a circuit diagram showing a first example of a programmable logic circuit according to a first embodiment.

A first example of the programmable logic circuit according to a first embodiment will be described below with reference to FIG. 2. The programmable logic circuit 140 according to the first example is used in switch blocks 130 of FPGAs, and includes at least one source line SL, at least one word line WL, at least one bit line BL crossing the source line SL, at least one cell 10, a CMOS inverter 20 for driving the source line SL, a cut-off transistor 32 connecting to the bit line BL, and a CMOS inverter 34 connecting to the bit line BL via the cut-off transistor 32. The CMOS inverter 20 can be eliminated if the source line SL can be driven by an element other than the CMOS inverter 20.

The cell 10 is disposed in an intersection region between the source line SL and the bit line BL, and includes a selection transistor 12 and a programmable device 14. The gate of the selection transistor 12 is connected to the word line (selection signal line) WL, and one of the source and the drain is connected to the source line SL. One terminal of the programmable device 14 is connected to the other of the source and the drain of the selection transistor 12, and the other terminal is connected to the bit line BL.

One selection transistor 12 is connected in series to each programmable device 14 in the first embodiment. If a write operation is performed on the programmable device 14, or the cell 10 is used in an FPGA operation, a voltage to turn ON the selection transistor 12 is applied to the gate thereof. The voltage applied is typically a power supply voltage Vdd if the selection transistor 12 is an n-channel MOS transistor. Although the selection transistor 12 and the cut-off transistor 32 are illustrated as n-channel MOS transistors in FIG. 2, they may be p-channel MOS transistors.

The programmable device 14 is generally programmed by a program voltage Vpp that is higher than the power supply voltage Vdd used in a logic operation. The CMOS inverters 20, 34, the selection transistor 12, and the cut-off transistor 32, however, are preferably formed of usual transistors that operate with the power supply voltage Vdd. Although high voltage transistor, which operates with the program voltage Vpp, is used in usual, it decreases FPGA operation performance and increases the circuit area. The use of usual transistors operating with the power supply voltage Vdd may allow FPGAs including the programmable devices 14 to be formed without increasing the circuit area.

Figure 3:
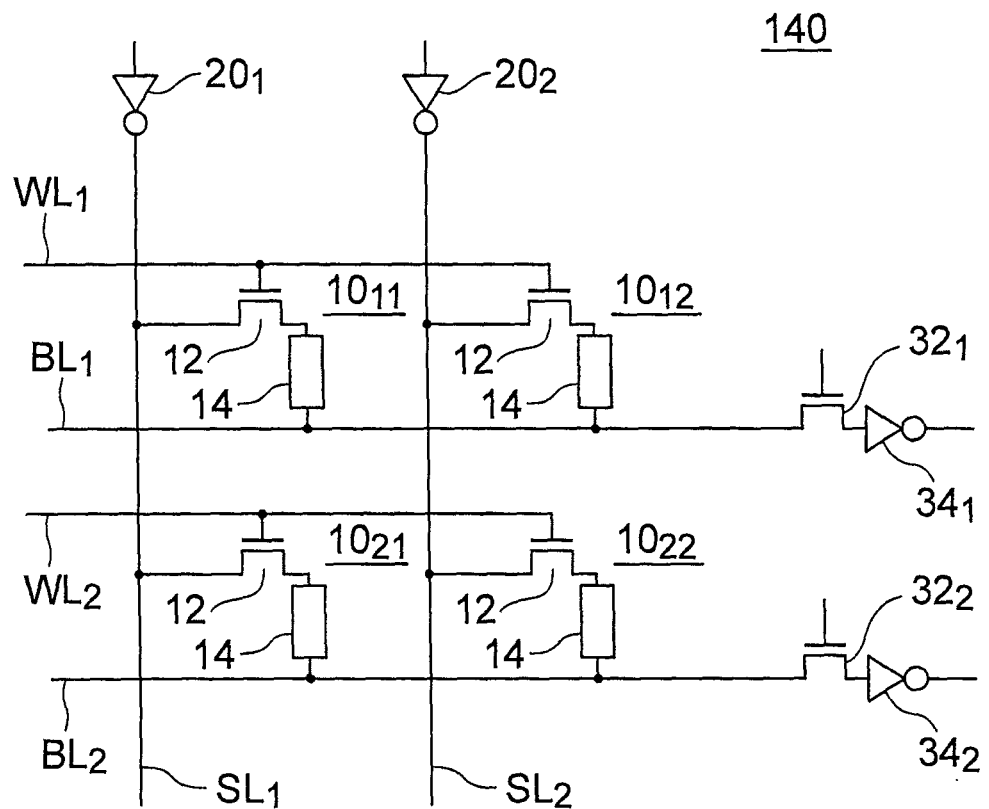
FIG. 3 is a circuit diagram showing a second example of the programmable logic circuit according to the first embodiment.

FIG. 3 shows a second example of the programmable logic circuit according to the first embodiment. The programmable logic circuit 140 according to the second example includes a 2×2 array (matrix) structure with four cells 10 shown in FIG. 2, and may be used for both switch blocks 130 and logic blocks 120 of FPGAs. The programmable logic circuit 140 according to the second example includes two source lines $SL_1$, $SL_2$, two word lines $WL_1$, $WL_2$, two bit lines $BL_1$, $BL_2$ crossing the source lines $SL_1$, $SL_2$, the four cells $10_{ij}$ (i, j=1, 2), CMOS inverters $20_j$ each driving one of the source lines $SL_j$ (j=1, 2), cut-off transistors $32_i$ each connecting to one of the bit lines $BL_i$ (i=1, 2), and CMOS inverters $34_i$ each connecting to the corresponding bit line $BL_i$ via the corresponding cut-off transistor $32_i$.

The cells $10_{i1}$, $10_{i2}$ arranged in the same row (i (i=1, 2)) share the corresponding word line $WL_i$ and the corresponding bit line $BL_i$, and the cut-off transistor $32_i$ and the CMOS inverter $34_i$ in the same row (i (i=1, 2)) share the corresponding bit line $BL_i$. The cells $10_{1j}$, $10_{2j}$ arranged in the same column (j=1, 2) share the corresponding source line $SL_j$ and the corresponding CMOS inverter $20_j$. The circuit area can be reduced with such a configuration.

Figure 4:
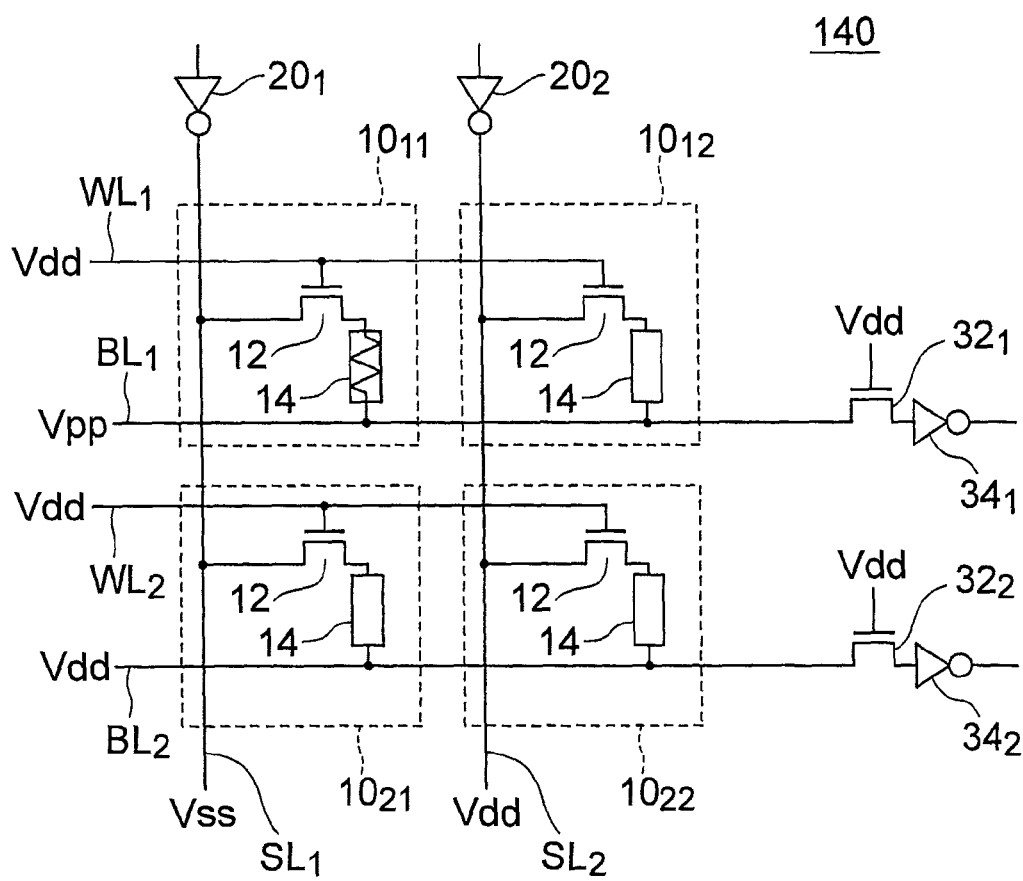
FIG. 4 is an explanatory diagram illustrating a write operation of the programmable logic circuit according to the second example.

A write operation of the cell $10_{ij}$ (i, j=1, 2) arranged in an array (matrix) will be described with reference to FIGS. 4 and 5. FIG. 4 shows a 2×2 matrix. The same operation can be performed by a 1×2 matrix, a 1×3 matrix, a 2×1 matrix, a 3×1 matrix, a 2×3 matrix, a 3×3 matrix, or any other matrix including more cells. Although n-channel MOS transistors are used as selection transistors and cut-off transistors in the descriptions with reference to FIGS. 4 and 5, p-channel MOS transistors may also be used to perform the same operation if the voltage Vdd is replaced with a reference voltage Vss, which is lower than Vdd.

FIG. 4 shows the state where all the programmable devices 14 in the cells $10_{ij}$ (i, j=1, 2) are fresh (virgin), and a write operation is performed on the programmable device 14 of the cell $10_{11}$. A voltage Vdd to turn ON the selection transistor 12 in the cell $10_{11}$ is applied to the word line $WL_1$ to which the selection transistor 12 of the cell $10_{11}$ is connected. A program voltage Vpp is applied to the bit line $BL_1$ to which the programmable device 14 of the cell $10_{11}$ is connected, and a reference potential Vss (usually the ground potential) is applied to the source line $SL_1$ to which the selection transistor 12 of the cell $10_{11}$ is connected. The voltage Vdd is also applied to all of the other wiring lines and terminals, for example the word line $WL_2$, the bit line $BL_2$, the source line $SL_2$, and the gates of the cut-off transistors $32_1$, $32_2$. As a result, a voltage Vpp−Vss is applied to the programmable device 14 of the cell $10_{11}$ to break down the programmable device 14 to make it conductive. Data is written to the programmable device 14 of the cell $10_{11}$ in this manner.

No data is written to the programmable devices 14 of the other cells $10_{12}$, $10_{21}$, $10_{22}$. For example, the selection transistor 12 of the cell $10_{12}$ in the OFF state since the voltage Vdd is applied to both the gate and the source. As a result, although the voltage Vpp is applied to one terminal of the programmable device 14 in the cell $10_{12}$, the voltage Vpp−Vss is not applied across the programmable device 14. Therefore, the programmable device 14 is not broken. Only the voltage Vdd−Vss is applied across the programmable device 14 of the cell $10_{21}$, and therefore the programmable device 14 thereof is not broken. The voltage Vdd is applied to both the gate and the source of the selection transistor 12 of the cell $10_{22}$. As a result, the selection transistor 12 thereof is in the OFF state. Although the voltage Vpp is applied to the drain of the cut-off transistor $32_1$ connected to the bit line $BL_1$, to which the cell $10_{11}$ and the cell $10_{12}$ are connected, the voltage Vdd is applied to the gate thereof. Assuming that the threshold voltage of the cut-off transistor $32_1$ is Vth_c, the cut-off transistor $32_1$ is turned OFF if the potential at the source thereof connecting to the CMOS inverter $34_1$ becomes Vdd−Vth_c, to prevent the voltage Vpp from being applied to the input terminal of the CMOS inverter $34_1$. This also prevents the breakdown of the CMOS inverter $34_1$.

The program voltage Vpp breaks the programmable device 14. An I/O voltage Vio for use in an input circuit may be used as the program voltage Vpp. This may prevent an increase in the circuit area since no power supply circuit should be newly added.

The upper limit of the program voltage Vpp is set so that the difference Vpp−Vdd between the voltages applied to the cut-off transistors $32_1$, $32_2$ would not break down the cut-off transistors $32_1$, $32_2$. The breakdown of the gate insulating film is time dependent, and should meet the following formula:

$$\frac{Vpp - Vdd}{Tox} < Ebk$$

where Ebk is the electric field at which the gate insulating film is broken in a certain programming time, and Tox is the thickness of the gate insulating film. The above formula can be translated into:

$Vpp < Ebk \times Tox + Vdd$.

The electric field Ebk required to perform programming in a few tens microseconds is about 20 MV/cm. This requires the program voltage Vpp to meet $Vpp < 2.0 \times 10^9 \times Tox + Vdd$.

Since the program voltage Vpp is greater than the voltage Vdd, $Vdd < Vpp < 2.0 \times 10^9 \times Tox + Vdd$.

For example, if Tox=5 nm, and Vdd=1.8V, $1.8V < Vpp < 11.8V$.

Thus, the program voltage Vpp can write data to the programmable device 14, but do not break down the gate insulating film of the transistor. This allows the wiring line to which the program voltage Vpp is applied to be directly amplified by the CMOS circuit, and the FPGA to operate at a high speed.

Figure 5:
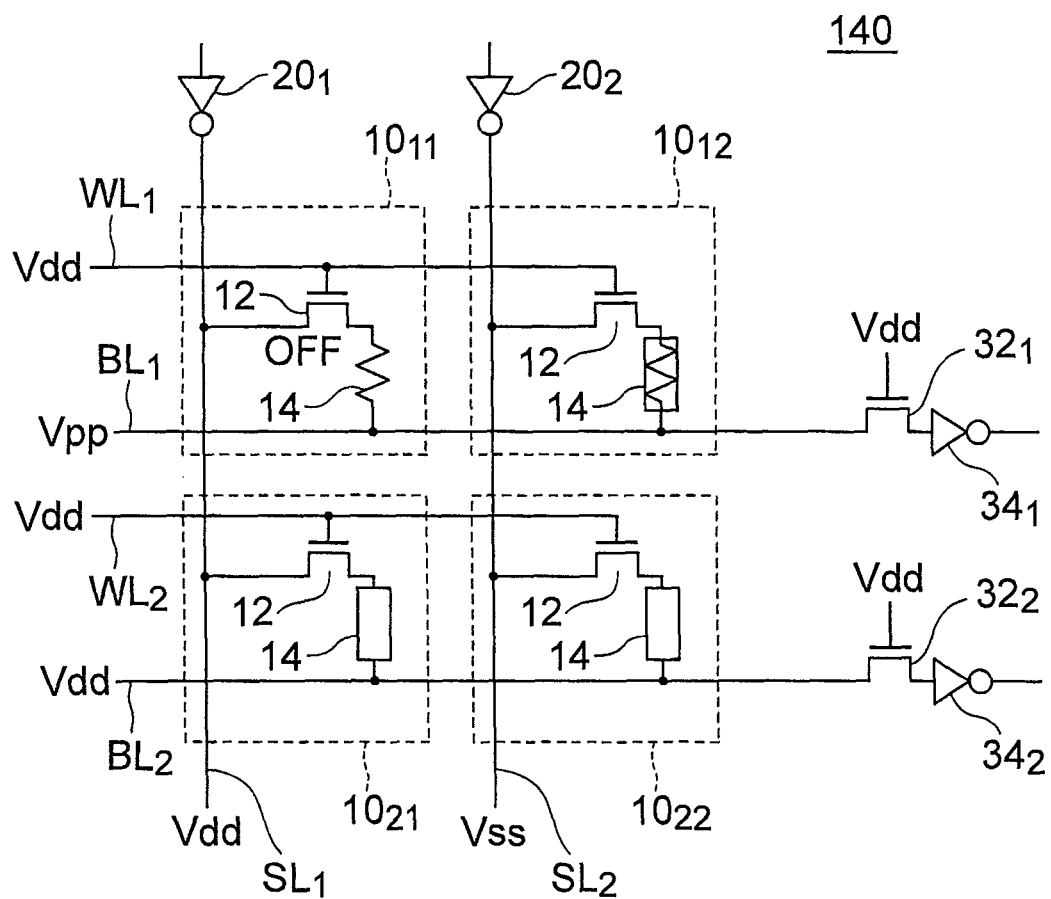
FIG. 5 is an explanatory diagram illustrating a write operation of the programmable logic circuit according to the second example.

FIG. 5 is an explanatory diagram illustrating an operation to write data the programmable device 14 of the cell $10_{12}$ after the cell $10_{11}$ is programmed. A program voltage Vpp is applied to the bit line $BL_1$ to which the cell $10_{11}$ and the cell $10_{12}$ are connected, a voltage Vdd is applied to the word line $WL_1$, and a voltage Vss is applied to the source line $SL_2$ to which the cell $10_{12}$ is connected. The voltage Vdd is also applied to the word line $WL_2$, the source line $SL_1$, and the bit line $BL_2$ to which the cell $10_{21}$ is connected. The programmable device 14 in the cell $10_{11}$ is already conductive. However, since the voltage Vdd is applied to the gate and the source of the selection transistor 12 of the cell $10_{11}$, the selection transistor 12 is in the OFF state. This prevents the sneak current caused by the program voltage Vpp to be applied to the other cells $10_{12}$, $10_{21}$, $10_{22}$. A voltage difference Vpp−Vss is applied across the programmable device 14 of the cell $10_{12}$ and breaks it. This allows data to be written to the programmable device 14 of the cell $10_{12}$. How the cells $10_{21}$, the cells $10_{22}$, the bit lines $BL_1$, $BL_2$, and the CMOS inverters $34_1$, $34_2$ are protected is the same as that in the case shown in FIG. 4.

Figure 6:
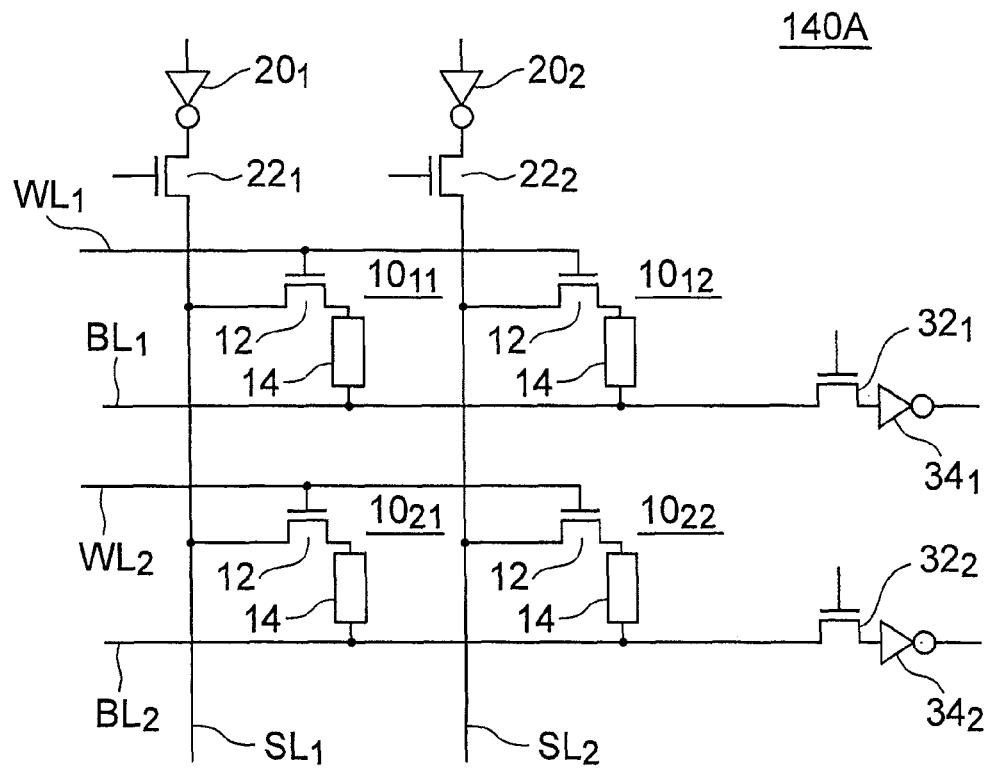
FIG. 6 is a circuit diagram showing a third example of the programmable logic circuit according to the first embodiment.

FIG. 6 shows a third example of the programmable logic circuit according to the first embodiment. The programmable logic circuit 140A according to the third example can be used for both the switch blocks 130 and the logic blocks 120 of FPGAs, and obtained by disposing cut-off transistors $22_1$, $22_2$ at the output sides of the CMOS inverters $20_1$, $20_2$ connecting to the source lines $SL_1$, $SL_2$, respectively, in the programmable logic circuit 140 according to the second example shown in FIG. 3.

As described with reference to FIGS. 4 and 5, basically the program voltage Vpp, which is high, is not applied to the source lines $SL_1$, $SL_2$. The program voltage Vpp, however, may be applied to the source line $SL_1$ immediately after the breakdown of the programmable device 14 of the cell $10_{11}$ is caused in FIG. 4. In actual cases, the voltage to be applied to the source line $SL_1$ may not become very high since the voltage is determined by the resistances of the broken programmable device 14, the selection transistor 12, and the n-channel MOS transistors or p-channel MOS transistors of the CMOS inverter $20_1$. If it is expected that a high voltage may be applied to the source line in view of the resistance of the broken programmable device and variations in resistance of the aforementioned transistors, the cut-off transistors $22_1$, $22_2$ are preferably disposed in order to prevent the breakdown of the CMOS inverters $20_1$, $20_2$ connected to the source lines $SL_1$, $SL_2$. Like the other devices, the voltage Vdd is also applied to the gates of the cut-off transistors $22_1$, $22_2$ in operation. This reliably prevents the breakdown of the CMOS inverters $20_1$, $20_2$ connected to the source lines $SL_1$, $SL_2$.

Figure 7:
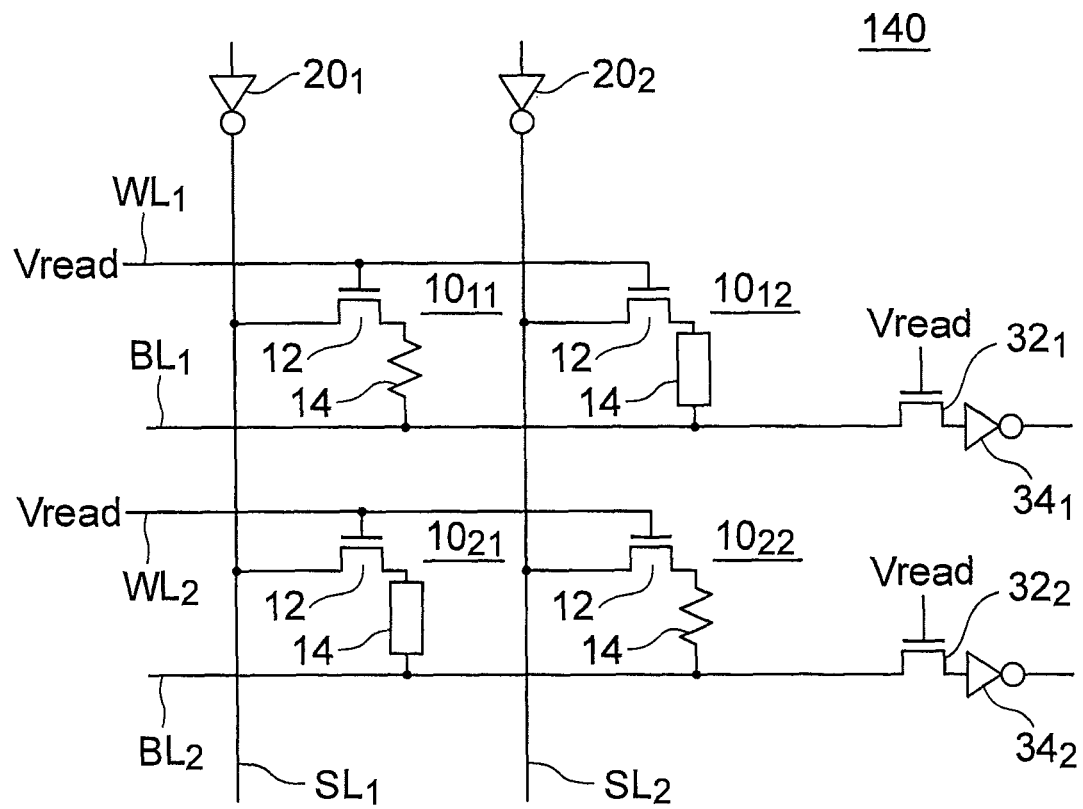
FIG. 7 is an explanatory diagram illustrating a read operation of the programmable logic circuit according to the second example.

A read operation of the programmable logic circuit 140 according to the second example shown in FIG. 3 will be described with reference to FIG. 7. The selection transistor 12 and the cut-off transistors $32_1$, $32_2$ are in the ON state. If the selection transistor 12 and the cut-off transistors $32_1$, $32_2$ are n-channel MOS transistors, the voltage Vdd may be applied to the gates. However, the values of operational signals of the FPGA may be reduced by the threshold voltage in this case to delay the operational speed. A read voltage Vread, which is higher than the voltage Vdd, is preferable since the FPGA operates without being delayed. The Vread can be expressed by the following formula if Vth_s=Vth_c:

$$Vread > Vdd + Vth\_c = Vdd + Vth\_s$$

where Vth_s is the threshold voltage of the selection transistor 12, and Vth_c is the threshold voltage of the cut-off transistors 32$_1$, 32$_2$. If Vth_s differs from Vth_c, the higher voltage is employed. For example, if Vth_s>Vth_c, $$Vread > Vdd + Vth\_s.$$

Figure 8:
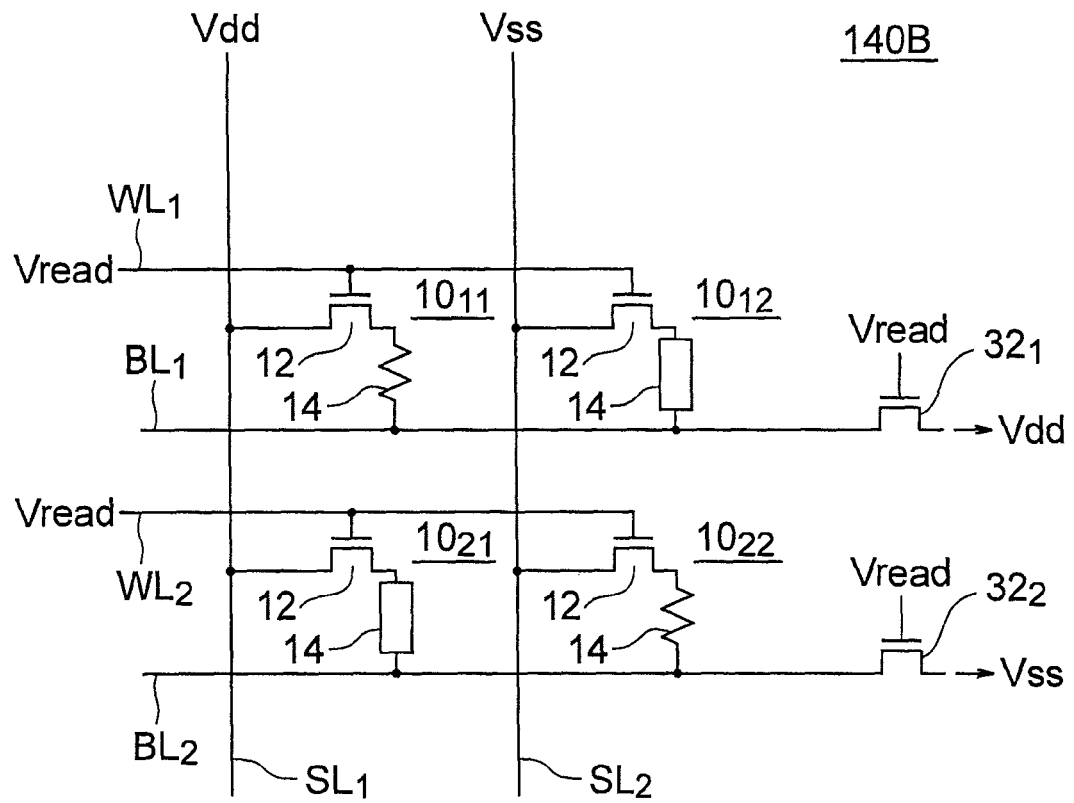
FIG. 8 is a circuit diagram showing a fourth example of the programmable logic circuit according to the first embodiment.

FIG. 8 shows a fourth example of the programmable logic circuit according to the first embodiment. The programmable logic circuit 140B of the fourth example is included in logic blocks 120 of FPGAs, and has a configuration with four cells 10 shown in FIG. 2 arranged in a 2×2 array. The programmable logic circuit 140B according to the fourth example includes two source lines SL$_1$, SL$_2$, two word lines WL$_1$, WL$_2$, two bit lines BL$_1$, BL$_2$ crossing the source lines SL$_1$, SL$_2$, four cells 10$_{ij}$, (i, j=1, 2), and cut-off transistors 32$_i$ each connecting to a corresponding bit line BL$_i$ (i=1, 2).

The programmable logic circuit 140B according to the fourth example programs one of the programmable devices 14 connected to each bit line BL$_i$ (i=1, 2). By applying a voltage Vdd to one of the two source line SL$_1$, SL$_2$ and a voltage Vss to the other, the voltage Vdd or Vss can be outputted from the bit lines BL$_1$, BL$_2$ depending on the state of the programmable devices 14. The subsequent operations are performed using the voltage Vdd and the voltage Vss like other logic circuits.

Figure 9A:
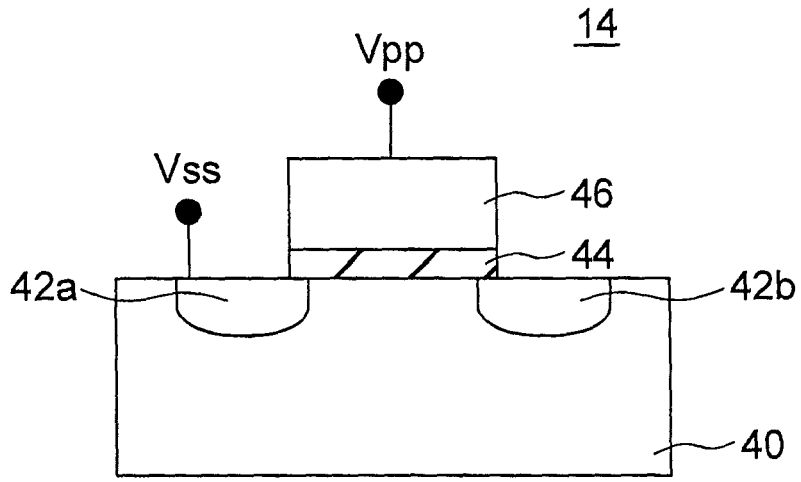
FIGS. 9A to 9C are cross-sectional views showing examples of a programmable device.
Figure 9B:
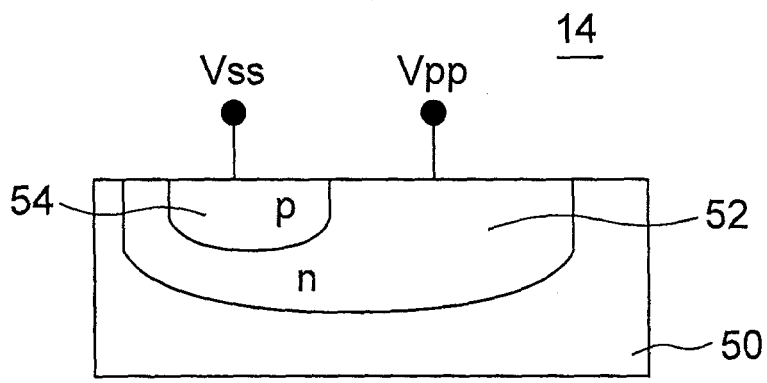
Figure 9C:
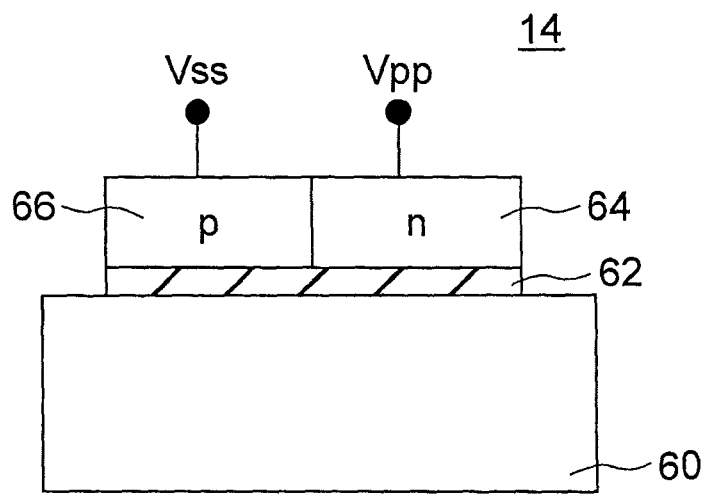

FIGS. 9A to 9C are cross-sectional views showing examples of the programmable device 14. FIG. 9A is a cross-sectional view showing a first example in which the programmable device 14 is a MOS transistor, and the write operation is performed by breaking down the gate insulating film of the MOS transistor. The programmable device 14 according to the first example includes a source 42a and a drain 42b disposed in a semiconductor layer 40 so as to be separated from each other, a gate insulating film 44 disposed on the semiconductor layer 40 between the source 42a and the drain 42b, the gate insulating film 44 partially overlapping the source 42a and the drain 42b, and a gate 46 disposed on the gate insulating film 44. The breakdown of the gate insulating film 44 is performed in a region where the gate 46 overlaps the source 42a by applying the program voltage Vpp to the gate 46 and the voltage Vss to the source 42a. Only the source side may be broken by setting the drain 42b to be in a floating state. This may reduce the circuit area since the number of wiring lines becomes the smallest in this case. Shallow Trench Isolation (STI) may be performed on the drain terminal that is not used.

An identical potential may be applied to both the source 42a and the drain 42b so that the insulating film 44 may be broken down in at least one of the regions where the insulating film 44 overlaps the source 42a and the drain 42b. This allows two overlapping regions to be broken down, thereby increasing the breakage probability and shortening the write time. This MOS transistor may be used as the cut-off transistor 32 and the CMOS inverter 34, which are driven by Vdd, and the thickness of the gate oxide film in this MOS transistor may be similar to that of the transistor used as the cut-off transistor 32 and the CMOS inverter 34 (with variations of about ±20%). Therefore, no special device should be prepared as the programmable device, and the number of processes and the manufacturing costs can be reduced.

An identical potential may be applied to the source 42a, the drain 42b, and the semiconductor layer 40. The number of wiring lines may be increased in this case, but the write time can be considerably reduced. The transistor in this case can be either an n-channel MOS transistor or a p-channel MOS transistor. The semiconductor layer 40, however, should be electrically isolated from adjacent devices if the gate 46 and the semiconductor layer 40 may be electrically connected to each other since FPGA signals pass through the broken and conducting path in the FPGA according to the first embodiment. Therefore, the terminal of the semiconductor layer 40 is preferably nonconductive (in the floating state). Alternatively, the reference voltage Vss is preferably applied to the terminal of the semiconductor layer 40 in the case of the n-channel MOS transistor, and the power supply voltage Vdd, the program voltage Vpp, or an intermediate voltage is preferably applied thereto in the case of the p-channel MOS transistor.

FIG. 9B shows a cross-sectional view of a second example, in which the programmable device 14 employs a pn junction, and a high reverse-bias voltage is applied to break down the pn junction to perform a write operation. The programmable device 14 according to the second example includes an n well 52 formed in a semiconductor layer 50, and a p well 54 formed in the n well 52. The program voltage Vpp is applied to the n well 52, and the voltage Vss is applied to the p well 54. The pn junction may also be formed by forming n well 52 in the p well 54.

FIG. 9C shows a cross-sectional view of a third example, in which the programmable device 14 employs a pn junction of polycrystalline silicon, and a high reverse-bias voltage is applied to break down the pn junction to perform a write operation. The programmable device 14 according to the third example includes an insulating film 62 disposed on a semiconductor layer 60, and an n layer 64 and a p layer 66 of polycrystalline silicon disposed on the insulating film 62. The n layer 64 and the p layer 66 are formed by introducing an n-type impurity and a p-type impurity to the gate of polycrystalline silicon in the MOS transistor. The junction region of the pn junction does not include silicide. Thus, the pn junction may be broken down by a high reverse-bias voltage. The pn junction of polycrystalline silicon can be made smaller than a pn junction with wells formed in a semiconductor layer.

As described above, according to the first embodiment, a voltage for writing data to a programmable device and not breaking down a gate insulating film of a transistor can be selected as the program voltage Vpp. This allows direct amplification of signals in wiring lines to which the program voltage Vpp is applied, thereby allowing a high speed operation.

(Second Embodiment)

Figure 10:
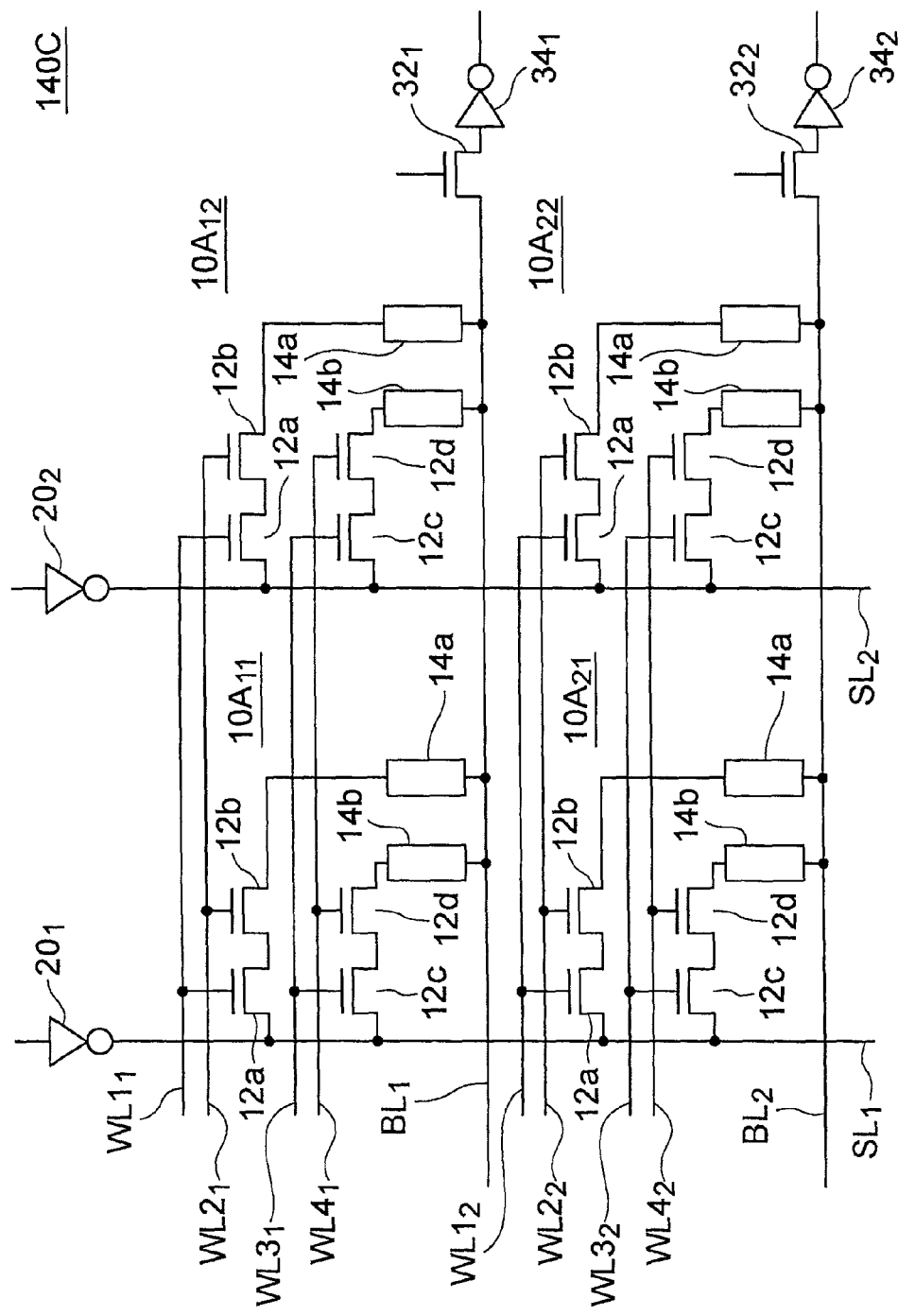
FIG. 10 is a circuit diagram showing a programmable logic circuit according to a second embodiment.

FIG. 10 shows a programmable logic circuit according to a second embodiment. The programmable logic circuit 140C according to the second embodiment is obtained by replacing the cells 10$_{11}$-10$_{22}$ of the programmable logic circuit 140 shown in FIG. 3 with cells 10A$_{11}$-10A$_{22}$. Each cell 10A$_{ij}$ (i, j=1, 2) includes four selection transistors 12a, 12b, 12c, 12d and two programmable devices 14a, 14b. The selection transistors 12a, 12b and the programmable device 14a is connected in series and the selection transistors 12c, 12d and the programmable device 14b are connected in series in each cell 10A$_{ij}$ (i, j=1, 2). Specifically, one of the source and the drain of the selection transistor 12a is connected to a source line SL$_j$, and the other is connected to one of the source and the drain of the selection transistor 12b, the other of the source and the drain of the selection transistor 12b is connected to one terminal of the programmable device 14a, and the other terminal of the programmable device 14a is connected to a bit line $BL_i$ in each cell $10A_{ij}$ (i, j=1, 2). One of the source and the drain of the selection transistor 12c is connected to the source line $SL_j$, the other is connected to one of the source and the drain of the selection transistor 12d, the other of the source and the drain of the selection transistor 12d is connected one terminal of the programmable device 14b, and the other terminal of the programmable device 14b is connected to the bit line $BL_i$ in each cell $10A_{ij}$ (i, j=1, 2).

The gate of the selection transistor 12a is connected to a word line $WL1_1$, and the gate of the selection transistor 12b is connected to a word line $WL2_1$ in each cell $10A_{1j}$ (j=1, 2). The gate of the selection transistor 12c is connected to a word line $WL3_1$ and the gate of the selection transistor 12d is connected to a word line $WL4_1$ in each cell $10A_{1j}$ (j=1, 2). The gate of the selection transistor 12a is connected to a word line $WL1_2$, and the gate of the selection transistor 12b is connected to the word line $WL2_2$ in each cell $10A_{2j}$ (j=1, 2). The gate of the selection transistor 12c is connected to a word line $WL3_2$ and the gate of the selection transistor 12d is connected to a word line $WL4_2$ in each cell $10A_{2j}$ (j=1, 2).

Such a configuration achieves a multi-context FPGA capable of switching from a circuit with a certain logic function to another circuit with another logic function instantaneously by switching between the programmable devices in a cell. The example here shows that each cell $10A_{ij}$ (i, j=1, 2) includes the two programmable devices 14a, 14b. A multi-context FPGA capable of writing more circuit information can be achieved by connecting more than two programmable devices in parallel. The circuit information can also be switched dynamically. The integration of the FPGA can be effectively improved by the multi-context configuration.

Figure 11:
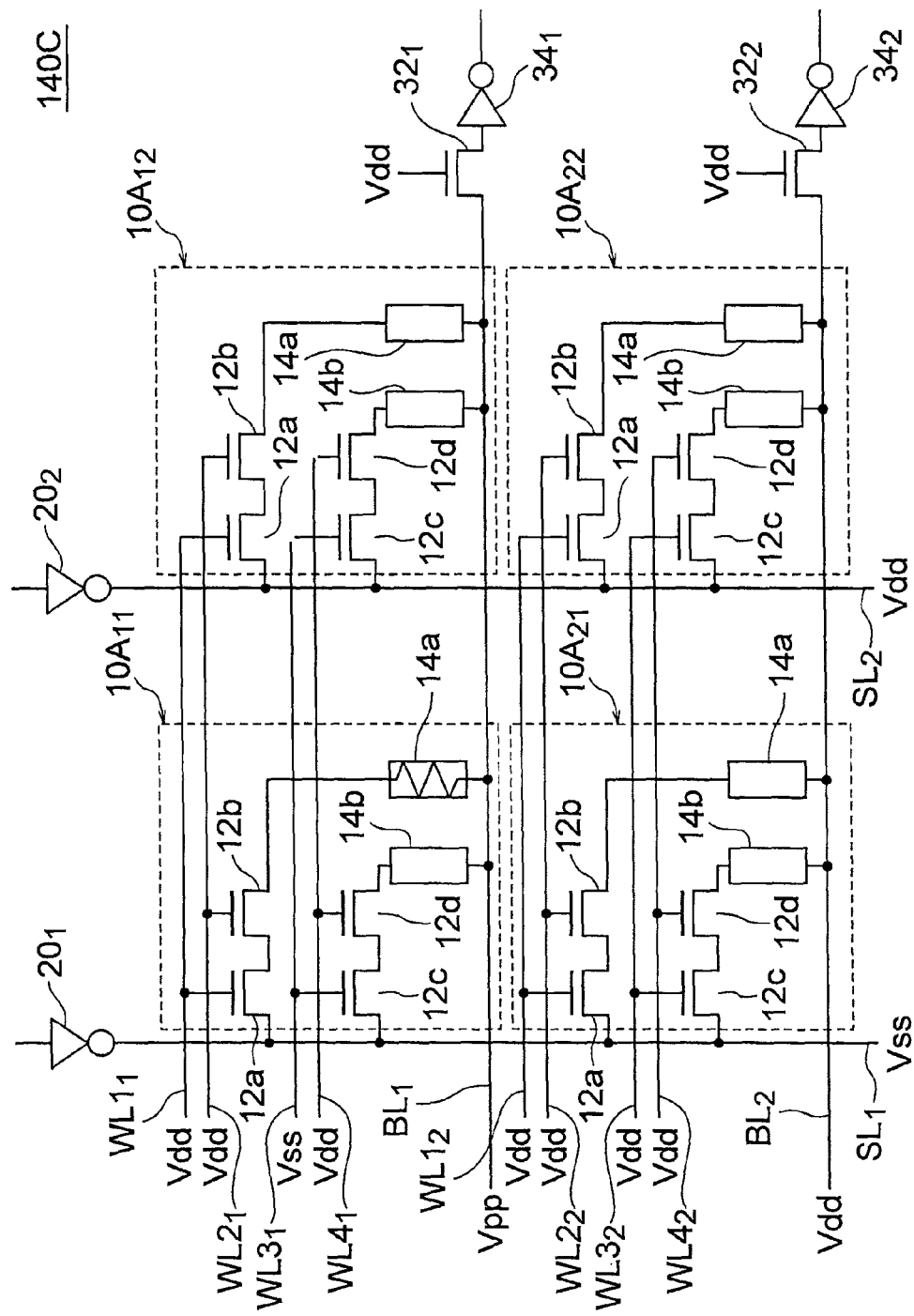
FIG. 11 is an explanatory diagram illustrating a write operation of the programmable logic circuit according to the second embodiment.

The write operation of the programmable device according to the second embodiment will be described with reference to FIG. 11. The breakdown of the programmable device 14a in the cell $10A_{11}$ will be described as an example. A write voltage (program voltage) Vpp is applied to the bit line $BL_1$ to which the programmable device 14a is connected, a voltage Vdd is applied to the gates of the two selection transistors 12a, 12b to which the programmable device 14a is connected, and a voltage Vss is applied to the source line $SL_1$. The voltage Vss is also applied to the gate of the selection transistor 12c connected to the programmable device 14b of the cell $10A_{11}$, and the voltage Vdd is also applied to the gate of the selection transistor 12d. It should be noted that the voltage Vss is applied to the selection transistor 12c connected to the source line $SL_1$. The voltage Vdd is also applied to the word lines $WL1_2$, $WL2_2$, $WL3_2$, $WL4_2$, the bit line $BL_2$, and the source line $SL_2$. The voltage Vdd is also applied to the gates of the cut-off transistors $32_1$, $32_2$. As a result, a voltage difference Vpp–Vss is applied across the programmable device 14a to break down the programmable device 14a. The programmable device 14b is not broken down since the voltage from the source line $SL_1$ is blocked by the two selection transistors 12c, 12d. The reason why the programmable devices 14a, 14b and the CMOS inverters $34_1$, $34_2$ in the other cells $10A_{12}$, $10A_{21}$, $10A_{22}$ are not broken down is the same as that for the first embodiment, and will not be described repeatedly.

Figure 12:
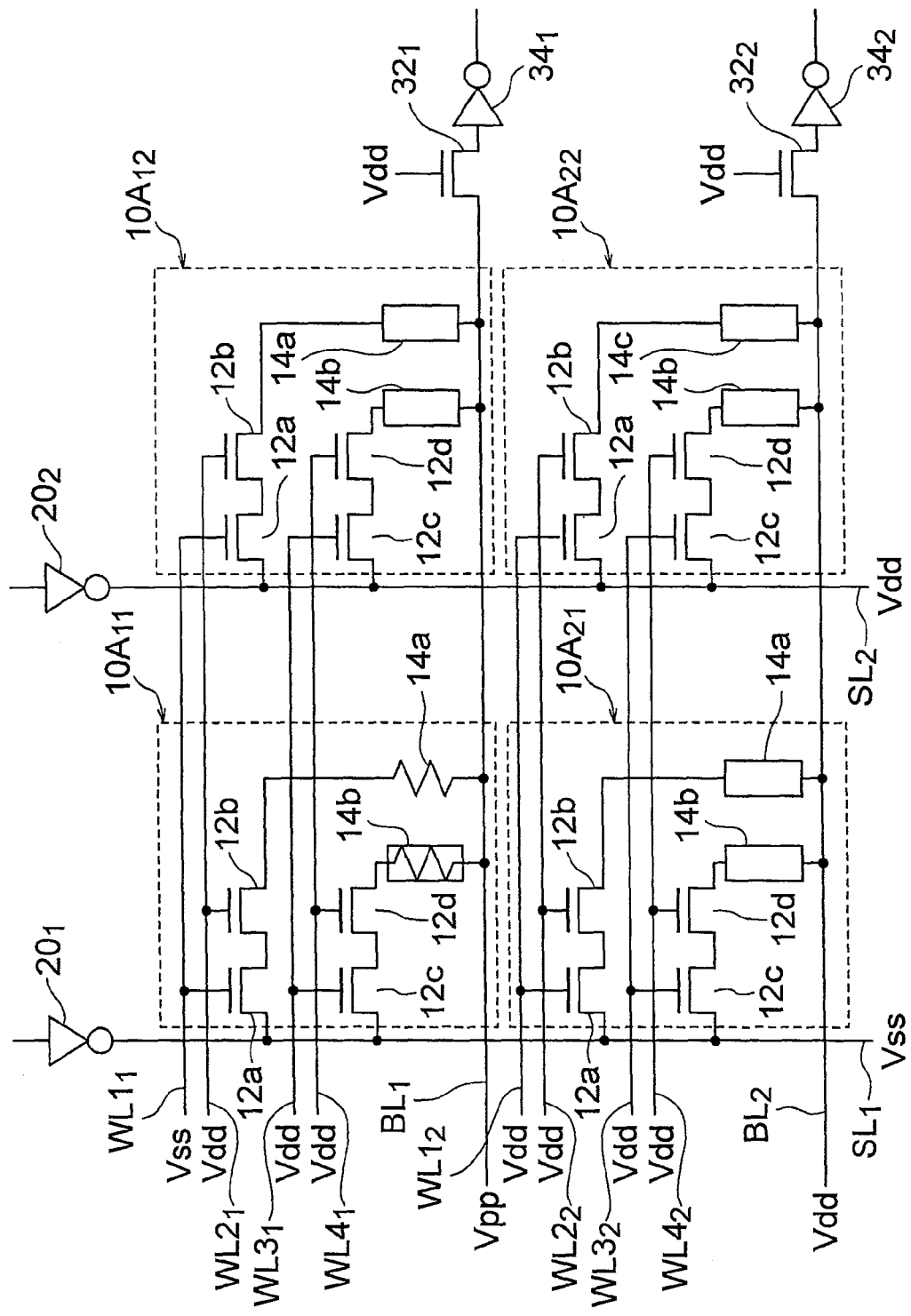
FIG. 12 is an explanatory diagram illustrating a write operation of the programmable logic circuit according to the second embodiment.

The write operation for the programmable device 14b in the cell $10A_{11}$ after the programmable device 14a is broken down will be described with reference to FIG. 12. The write voltage Vpp is applied to the bit line $BL_1$, the voltage Vss is applied to the word line $WL1_1$, and the voltage Vdd is applied to the word lines $WL2_1$, $WL3_1$, $WL4_1$, $WL1_2$, $WL2_2$, $WL3_2$, $WL4_2$, the bit line $BL_2$, and the source line $SL_2$. The voltage Vdd is also applied to the gates of the cut-off transistors $32_1$, $32_2$. The programmable device 14b of the cell $10A_{11}$ is broken down by the voltage Vpp–Vss applied thereto. The write voltage Vpp is also applied to one terminal of the programmable device 14a in the cell $10A_{11}$. This write voltage Vpp, however, is conveyed to the drain terminal of the selection transistor 12b since the programmable device 14a has already been broken. Since the voltage Vdd is applied to the gate of the selection transistor 12b, a voltage Vpp–Vdd is applied between the gate and the drain of the selection transistor 12b. Therefore, the selection transistor 12b is not broken down. Assuming that the threshold voltage of the selection transistor 12b is Vthc, a voltage Vdd–Vthc is applied to the drain terminal of the selection transistor 12a. Since the voltage Vss is applied to the gate of the selection transistor 12a, a voltage Vdd–Vthc–Vss is applied between the gate and the drain of the selection transistor 12a. As a result, the selection transistor 12a is not broken down. The reason why the other elements of the cells $10A_{12}$, $10A_{21}$, $10A_{22}$ and the CMOS inverters $34_1$, $34_2$ are not broken down is the same as that for the first embodiment. A multi-context FPGA including programmable devices can be achieved in this manner without breaking down devices unnecessarily.

Multi-context FPGAs have improved integration. A multi-context FPGA includes a plurality of configuration memories (programmable logic circuits) per one FPGA circuit, and switches the configuration memories in a read operation to switch to other circuit configurations instantaneously. If the switching of the configuration memories is performed on the application basis, a plurality of FPGA chips can be effectively achieved by one chip. Furthermore, dynamic reconfiguration can be performed by switching the configuration memories dynamically. This allows the reduction in area of FPGAs.

Figure 13:
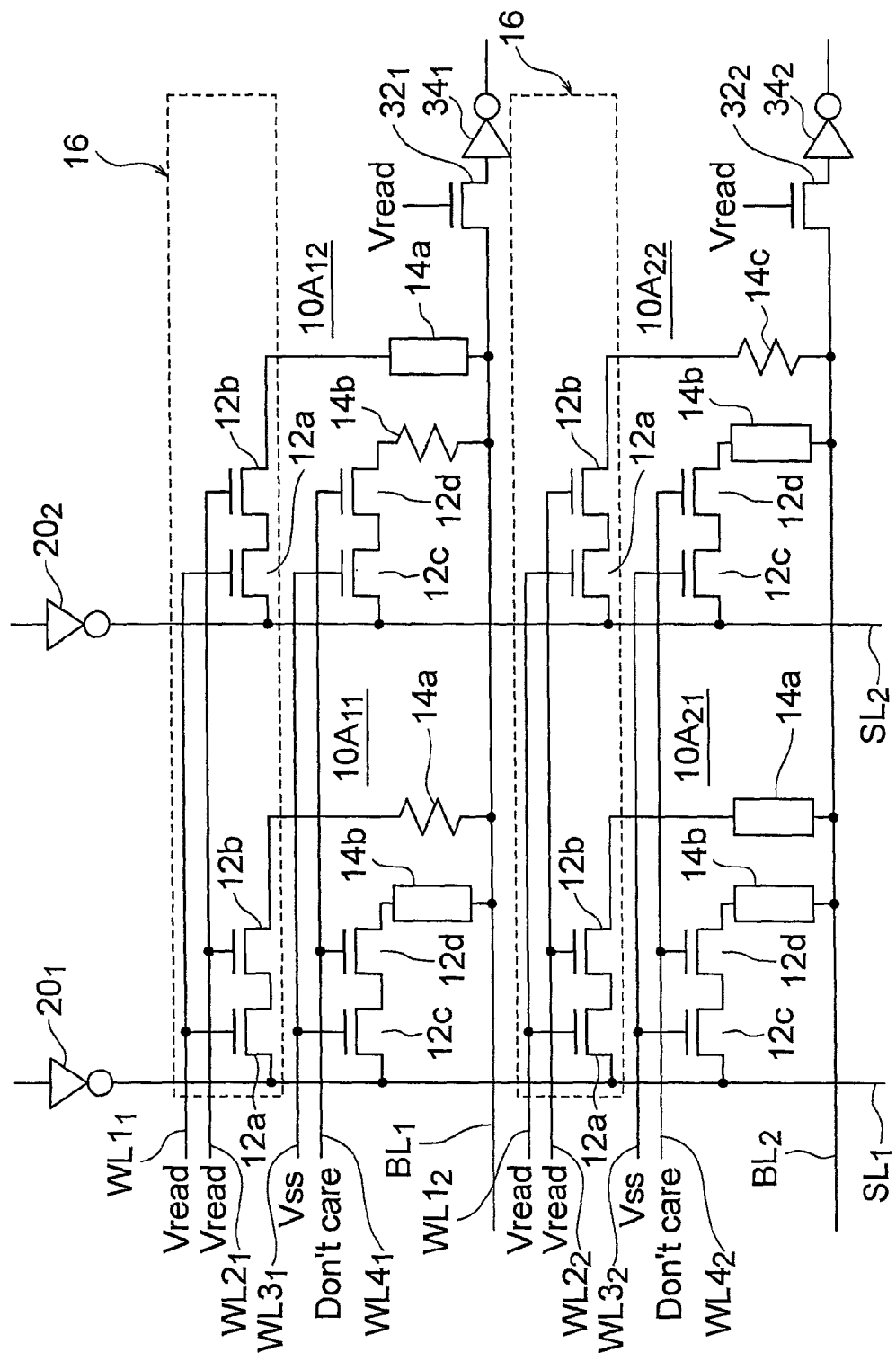
FIG. 13 is an explanatory diagram illustrating an FPGA operation of a multi-context FPGA including the programmable logic circuit according to the second embodiment.

An FPGA operation of a multi-context FPGA including the programmable logic circuit according to the second embodiment shown in FIG. 10 will be described with reference to FIG. 13. A voltage Vread is applied to the gates of the selection transistors 12a, 12b connected to the programmable devices 14a for a selected context 16 to turn ON the selection transistors 12a, 12b. As in the case of the first embodiment, the voltage Vread may be the power supply voltage Vdd, or a voltage greater than Vdd by the threshold voltage of the selection transistor and the cut-off transistor. A voltage Vss is applied to the gate of one of the selection transistors 12c, 12d connected to the programmable device 14b for the non-selected context, for example the selection transistor 12c, to turn it OFF, and a voltage Vss or Vdd is applied to the gate of the other, for example the selection transistor 12d. This allows signals in FPGA operation to pass through the programmable device 14a for the selected context 16 to perform a circuit operation in accordance with the data written to the programmable device 14a. The switching of the selected context can be performed instantaneously by changing the gate voltages applied to the selection transistors. This improves the integration of the FPGA effectively.

As described above, according to the second embodiment, a voltage for writing data to a programmable device and not breaking down the gate insulating film of a transistor can be selected as the program voltage Vpp as in the first embodiment. This allows direct amplification of signals passing through wiring lines to which the program voltage Vpp is applied, thereby allowing a high speed operation.

(Third Embodiment)

Figure 14A:
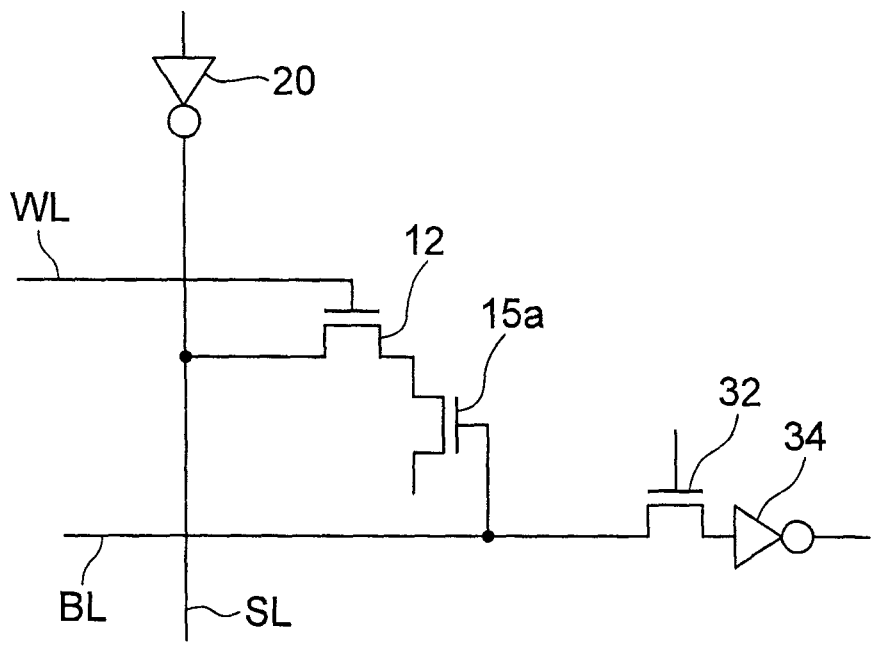
FIGS. 14A and 14B are circuit diagrams illustrating a first example and a second example of a programmable logic circuit according to a third embodiment.
Figure 14B:
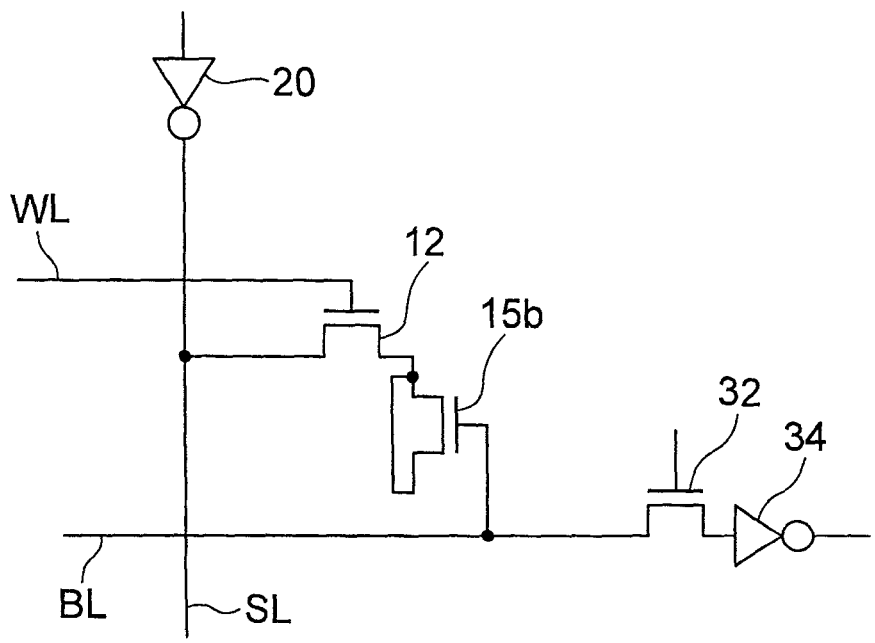

A programmable logic circuit according to a third embodiment will be described with reference to FIG. 14A and 14B. The programmable logic circuit according to the third embodiment employs a MOS transistor of the type where the gate insulating film is to be broken down as the programmable device 14 of the programmable logic circuit according to the first example of the first embodiment shown in FIG. 2. FIGS. 14A and 14B are circuit diagrams showing a first example and a second example of the programmable logic circuit according to the third embodiment. The gate of a MOS transistor 15a in the programmable logic circuit according to the first example shown in FIG. 14A is connected to a bit line BL, one of the source and the drain is connected to one of the source and the drain of a selection transistor 12, and the other of the source and the drain of the MOS transistor 15a is connected to nowhere. The gate of a MOS transistor 15b of the programmable logic circuit according to the second example shown in FIG. 14B is connected to a bit line BL, and both the source and the drain thereof are connected to one of the source and the drain of a selection transistor 12. The programmable device 14 basically has two terminals, and which terminals are connected to which wiring lines does not matter. However, in breaking down the gate insulating film of a MOS transistor a high potential program voltage is preferably applied to the gate thereof since if the high potential program voltage is applied to at least one of the source and the drain of the MOS transistor, the regions of the PN-junction of source and the drain connecting the semiconductor layer may possibly be broken down earlier than the gate insulating film of the MOS transistor.

As described above, according to the third embodiment, a voltage for writing data to a programmable device and not breaking down the gate insulating film of a transistor can be selected as the program voltage Vpp as in the first embodiment. This allows direct amplification of signals of wiring lines to which the program voltage Vpp is applied, thereby allowing a high speed operation.

In the first to third embodiments, cut-off transistors $32_1$, $32_2$ are provided to connect to the bit lines $BL_1$, $BL_2$. Cut-off transistors $32_1$, $32_2$ can be provided to connect to the source lines $SL_1$, $SL_2$.

(Fourth Embodiment)

Figure 15A:
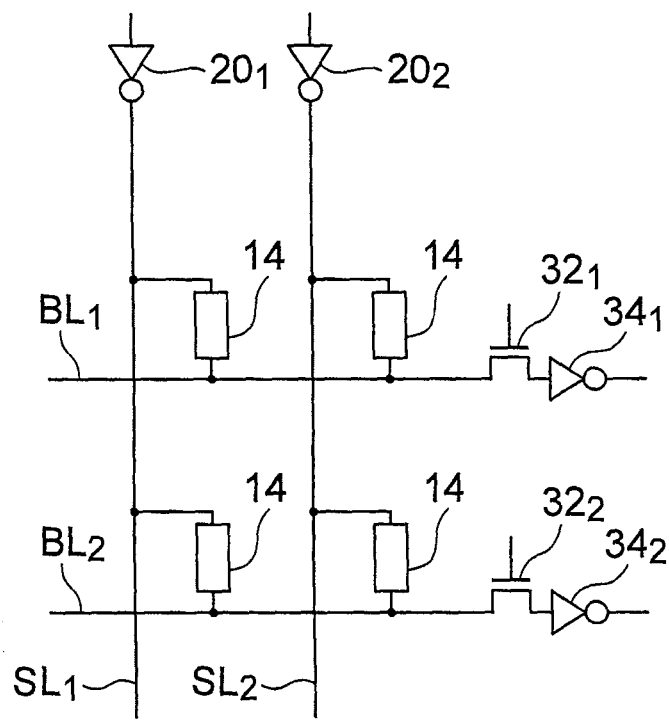
FIGS. 15A and 15B are circuit diagrams illustrating a first example and a second example of a programmable logic circuit according to a fourth embodiment.
Figure 15B:
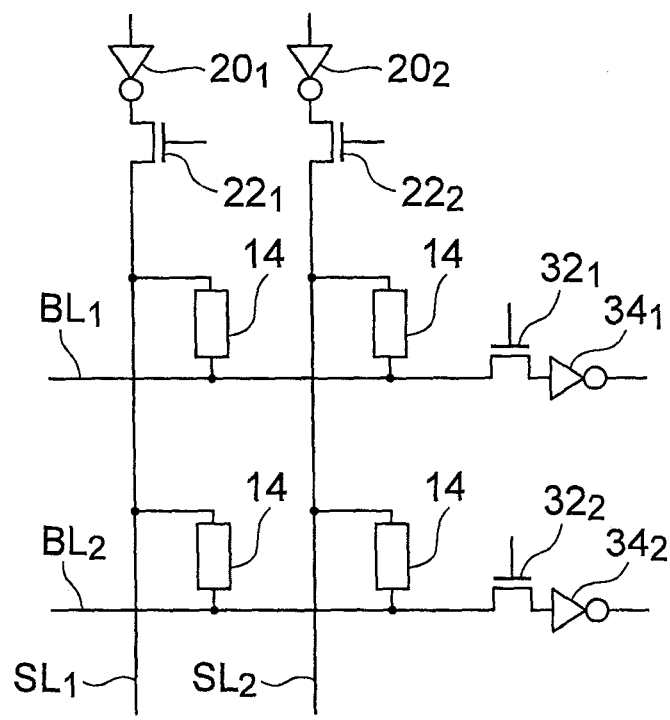

A programmable logic circuit according to a fourth embodiment will be described with reference to FIGS. 15A and 15B, which are circuit diagrams showing a first example and a second example of the programmable logic circuit according to the fourth embodiment.

Generally, a cell to be programmed is selected or not selected by a selection transistor connected to a word line. If it is known in advance that only one programmable device of a cell in a series of cells is to be programmed, no selection transistor may be used for the series of cells.

The programmable logic circuit according to the first example of the fourth embodiment is obtained by eliminating the selection transistor 12 from each cell of the programmable logic circuit according to the second example of the first embodiment shown in FIG. 3. Therefore, the cut-off transistors $32_1$, $32_2$ are disposed before the CMOS inverters $34_1$, $34_2$ on the output side.

The programmable logic circuit according to the second example of the fourth embodiment is obtained by eliminating the selection transistor 12 from each cell of the programmable logic circuit according to the third example of the first embodiment shown in FIG. 6. Therefore, the cut-off transistors $32_1$, $32_2$ are disposed before the CMOS inverters $34_1$, $34_2$ on the output side, and the cut-off transistors $22_1$, $22_2$ are disposed after the CMOS inverters $20_1$, $20_2$ on the input side.

The series of cells may be a row of cells, or a column of cells. If a high potential program voltage Vpp can be applied to only one programmable device 14 in a series of cells in a programming operation, it is not necessary to concern an increase in leakage current and an occurrence of sneak current during programming operation. (sneak current is a current flowing from a target cell that is in the ON state to another cell in the ON state through wiring lines). If, for example, only one of the programmable devices 14 that share a bit line, for example the bit line $BL_1$, to which the program voltage Vpp is applied, should be programmed, the first example or the second example of the fourth embodiment that do not include any selection transistor may be employed.

As described above, according to the fourth embodiment, a voltage for writing data to a programmable device and not breaking down the gate insulating film of a transistor can be selected as the program voltage Vpp as in the first embodiment. This allows direct amplification of signals on wiring lines to which the program voltage Vpp is applied, thereby allowing a high speed operation.

(Fifth Embodiment)

A programmable logic circuit according to a fifth embodiment will be described with reference to FIG. 16. The programmable logic circuit according to the fifth embodiment employs a programmable device 14A shown in FIG. 16 as the programmable device 14 of the programmable logic circuit according to any of the first embodiment, the second embodiment, and the fourth embodiment.

Figure 16:
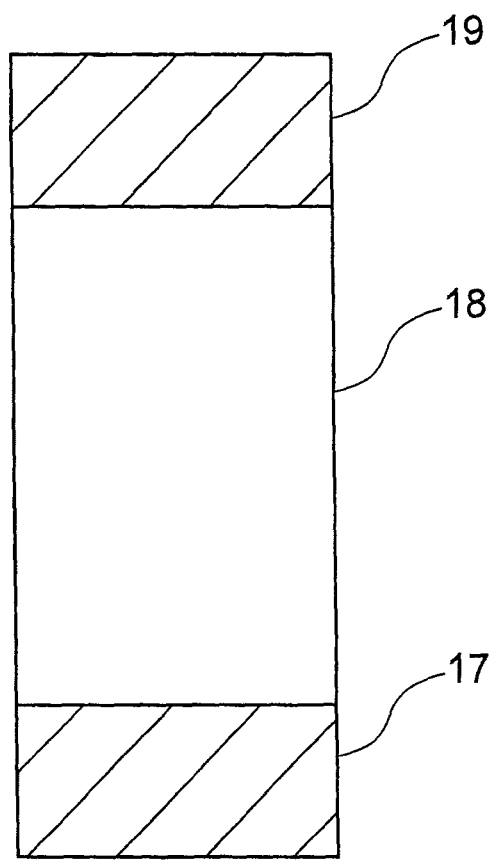
FIG. 16 is a cross-sectional view showing an example of a programmable device included in a programmable logic circuit according to a fifth embodiment.

The programmable device 14A shown in FIG. 16 is a resistive change nonvolatile memory including a lower electrode 17 with one or more layers, a resistive change film 18 with one or more layers, and an upper electrode 19 with one or more layers, the lower electrode 17, the resistive change film 18, and the upper electrode 19 being stacked in this order. The resistance value of the resistive change film 18 can be changed to a high resistance value, a low resistance value, and an intermediate resistance value depending on the magnitude, the direction, and the application time of the voltage applied between the upper electrode 19 and the lower electrode 17. In order to bring an insulating film of a resistive change memory into a state where the resistance value thereof can be changed, a high voltage is generally applied to the resistive change film to introduce defects (filament) thereto. By setting the initial voltage (forming voltage) in this case to be the voltage Vpp, the operation to introduce defects can be performed in a similar manner to the operation to program the programmable device 14. Therefore, a resistive change memory can be employed as the programmable device of the programmable logic circuit according to any of the first embodiment, the second embodiment, and the fourth embodiment. The resistive change memory serving as the programmable device 14 becomes a nonvolatile memory after defects are introduced thereto. Accordingly, the FPGA can be repeatedly rewritten.

As described above, according to the fifth embodiment, a voltage for writing data to a programmable device and not breaking down the gate insulating film of a transistor can be selected as the program voltage Vpp as in the first embodiment. This allows direct amplification of signals on wiring lines to which the program voltage Vpp is applied, thereby allowing a high speed operation.

(Sixth Embodiment)

Figure 17:
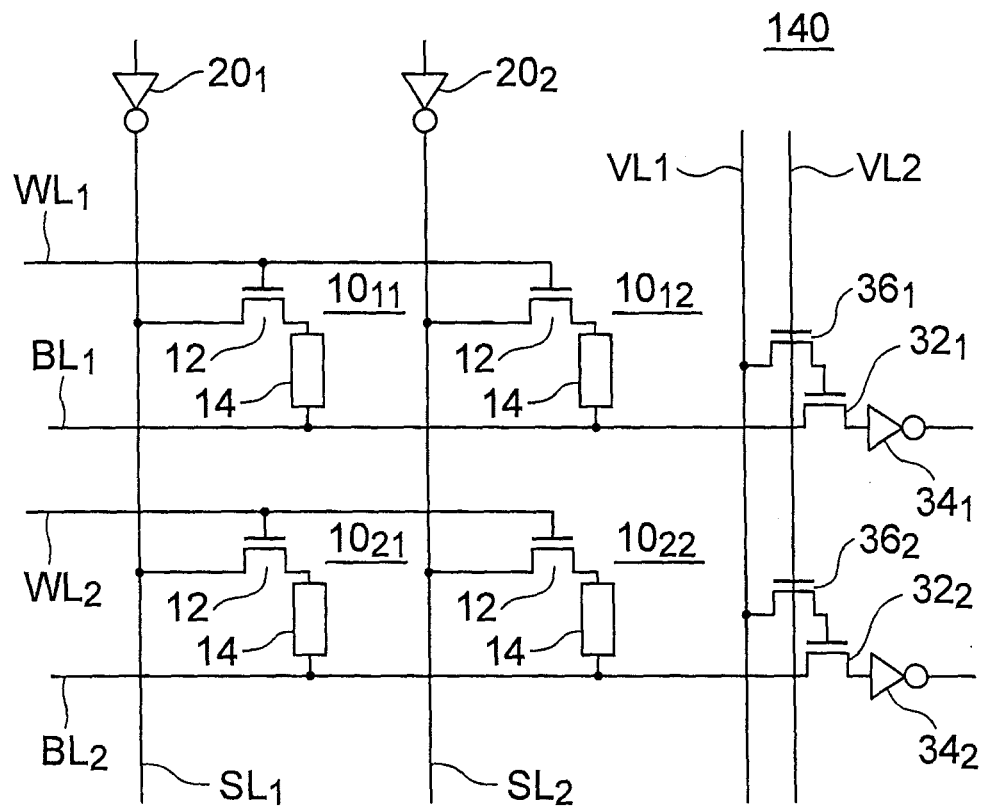
FIG. 17 is a circuit diagram showing an example of a programmable logic circuit according to a sixth embodiment.

A programmable logic circuit according to a sixth embodiment will be described with reference to FIGS. 17 to 20. The programmable logic circuit according to the sixth embodiment is obtained by adding further transistors to the programmable logic circuit according to any of the first embodiment to the fifth embodiment, one of the source and the drain of each transistor added being connected to the gate of a cut-off transistor. FIG. 17 shows an example of the programmable logic circuit according to the sixth embodiment. The programmable logic circuit 140 includes transistors $36_1$, $36_2$, of each of which one of the source and the drain is connected to the gate of one of the cut-off transistors $32_1$ or $32_2$ of the programmable logic circuit 140 according to the second example of the first embodiment shown in FIG. 3. The other of the source and the drain of each transistor $36_i$ (i=1, 2) is connected to a power supply line VL1, and the gate is connected to a power supply line VL2.

(Operation)

Figure 18:
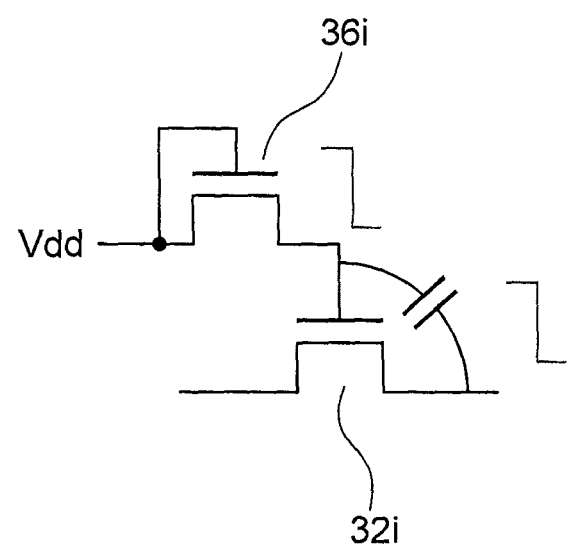
FIG. 18 is a diagram showing a circuit configuration of the sixth embodiment for causing the bootstrap effect.

In a normal operation, the diode connection of the transistor $36_i$ (i=1, 2) to the gate of the corresponding cut-off transistor $32_i$ is achieved by applying a power supply voltage Vdd to the power supply line VL1 and the power supply line VL2 as shown in FIG. 18. The resistance is high from the gate of the transistor $36_i$ (i=1, 2) to the power supply voltage Vdd since this direction is a backward direction in the diode. Therefore, a considerable bootstrap effect can be obtained. The bootstrap effect here means that if a pulse signal is given to one of the source and the drain of an n-channel MOS transistor, the potential of the gate increases due to capacitive coupling of the gate and the one of the source and the drain. As a result, the application of the voltage Vdd results in a voltage more than Vdd to be applied to the gate of the cut-off transistor $32_i$. This allows a normal operation to be performed without reducing the operational speed. The cut-off transistor $32_i$ (i=1, 2) is not turned OFF during normal operations and write operations, and therefore the voltage Vss is not needed to be given to the gate of the cut-off transistor $32_i$ (i=1, 2). This allows the programmable logic circuit according to the sixth embodiment to be achieved. In a write operation, the voltage applied to the power supply line VL2 is set to turn ON the transistor $36_i$ (i=1, 2) to reduce the resistance, thereby reducing the bootstrap effect to prevent the breakdown of the gate insulating film of the cut-off transistor $32_i$ (i=1, 2).

Figure 19B:
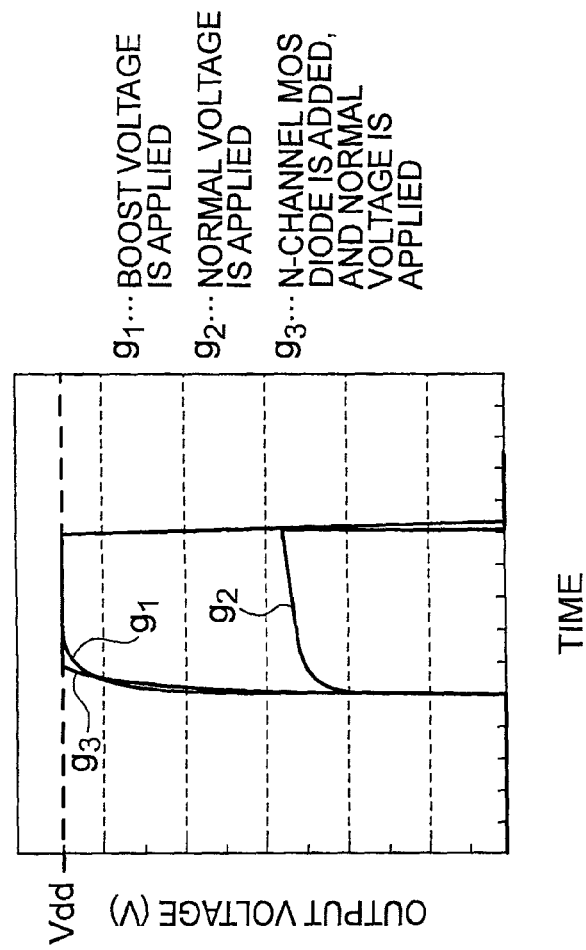
FIG. 19B is a diagram showing simulation results relating to the bootstrap effect.
Figure 19A:
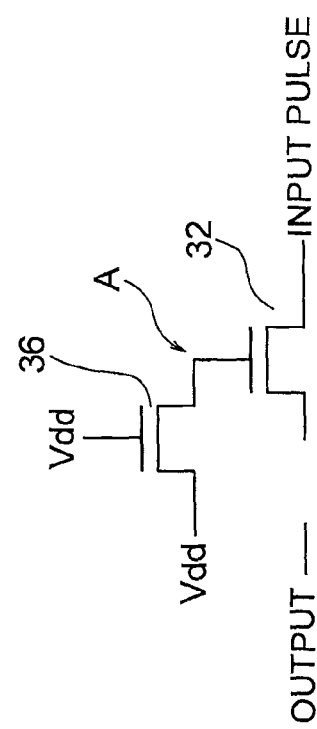
FIG. 19A is a diagram showing a circuit used for a simulation relating to the bootstrap effect.

FIGS. 19A and 19B shows simulation results regarding the bootstrap effect. The simulations were performed on the circuit shown in FIG. 19A by means of a simulator "Spice." In this circuit, one of the source and the drain of the transistor 36 is connected to the gate of the cut-off transistor 32. The lines $g_1$ and the line $g_2$ in FIG. 19B show the simulation results of cases where the transistor 36 was removed from the circuit shown in FIG. 19A and a voltage was directly applied to the point A, i.e., the gate of the cut-off transistor 32. If a normal voltage is applied to this circuit, the output signal degrades as indicated by the line $g_2$ in FIG. 19B. If the voltage applied to the gate of the cut-off transistor 32 is increased ("boost voltage"), the output signal rapidly reaches the voltage Vdd as indicated by the line $g_1$. The output signal obtained by the circuit with the transistor 36 as shown in FIG. 19A is about the same as that obtained by applying the boost voltage, as can be understood from the line $g_3$ in the simulation results shown in FIG. 19B. This means that the bootstrap effect prevented the degradation of the output signal.

Figure 20:
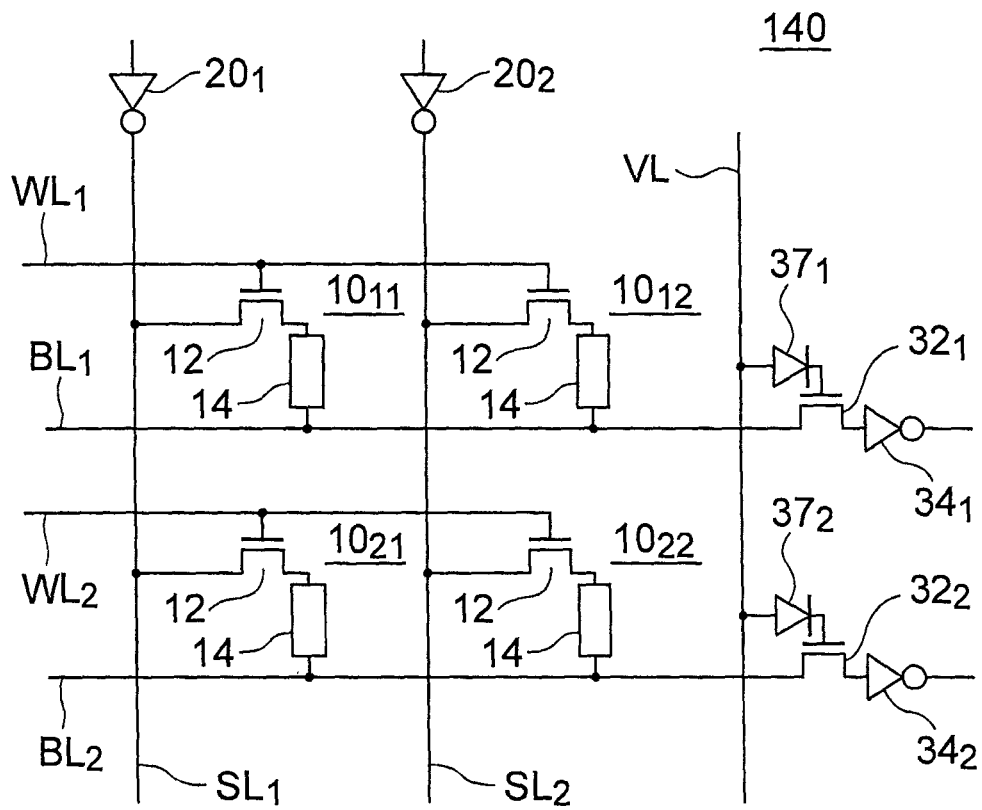
FIG. 20 is a circuit diagram showing an example of a programmable logic circuit according to a modification of the sixth embodiment.

If the write voltage is not so high, a power supply line VL may serve as the power supply line VL1 and the power supply line VL2 to decrease the number of wiring lines connected to the terminals. This may reduce the area. Diodes $37_i$ may be used instead of the transistors $36_i$ (i=1, 2) as shown in FIG. 20.

As described above, a programmable logic circuit can be provided according to the sixth embodiment, the programmable logic circuit operating without increasing power consumption and providing signals that are not degraded in normal operation, the gate insulating film of the cut-off transistor in the programmable logic circuit not being broken down when write pulses are applied.

According to the sixth embodiment, a voltage for writing data to a programmable device and not breaking down a gate insulating film of a transistor can be selected as the program voltage Vpp as in the case of the first embodiment. This allows direct amplification of signals on wiring lines to which the program voltage Vpp is applied, thereby allowing a high speed operation.

(Seventh Embodiment)

Figure 21:
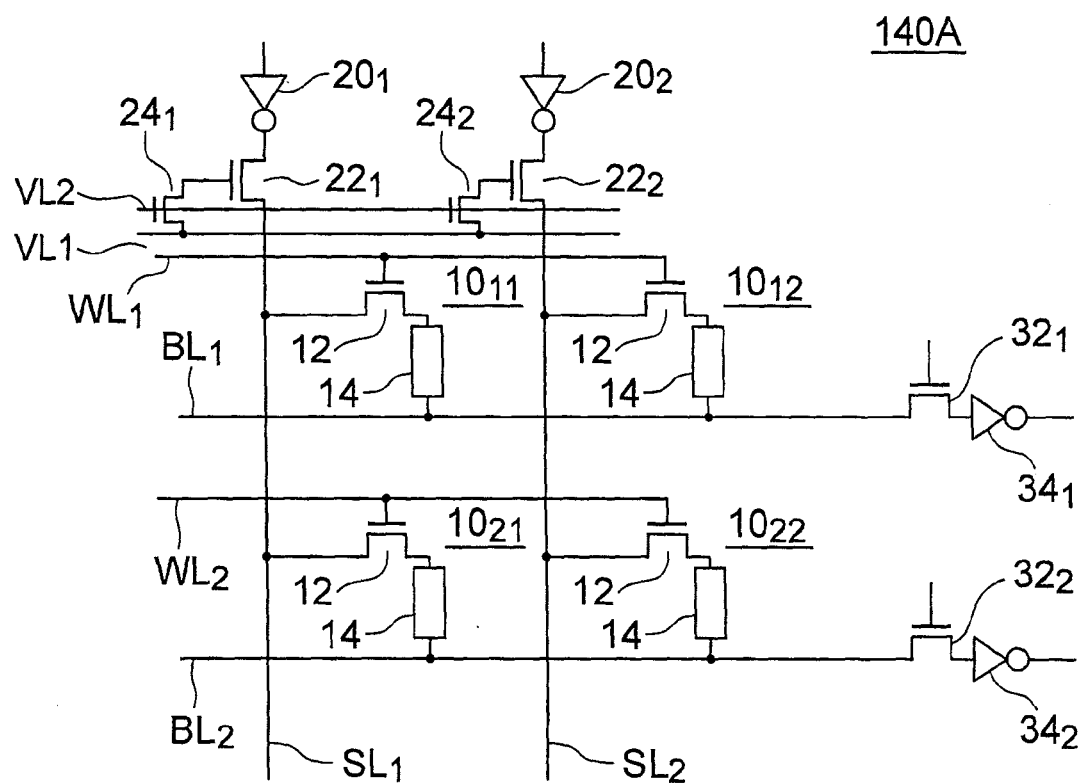
FIG. 21 is a circuit diagram showing an example of a programmable logic circuit according to a seventh embodiment.

FIG. 21 shows a programmable logic circuit according to a seventh embodiment. The programmable logic circuit according to the seventh embodiment is obtained by adding transistors $24_1$, $24_2$ to the programmable logic circuit according to the third example of the first embodiment shown in FIG. 6, one of the source and the drain of each transistor being connected to the gate of the corresponding cut-off transistor $22_1$ or $22_2$. The other of the source and the drain of each transistor $24_i$ (i=1, 2) is connected to a power supply line VL1, and the gate is connected to a power supply line VL2.

As in the case of the sixth embodiment, a programmable logic circuit can be provided according to the seventh embodiment, the programmable logic circuit operating without increasing power consumption and providing signals that are not degraded in a normal operation, the gate insulating film of the cut-off transistor in the programmable logic circuit not being broken down when write pulses are applied.

According to the seventh embodiment, a voltage for writing data to a programmable device and not breaking down a gate insulating film of a transistor can be selected as the program voltage Vpp as in the case of the first embodiment. This allows direct amplification of signals on wiring lines to which the program voltage Vpp is applied, thereby allowing a high speed operation.

As in the case of the sixth embodiment, transistors $36_1$, $36_2$ may be added to the programmable logic circuit according to the seventh embodiment, one of the source and the drain of each transistor being connected to the gate of the corresponding cut-off transistor $32_1$ or $32_2$.

(Eighth Embodiment)

Figure 22:
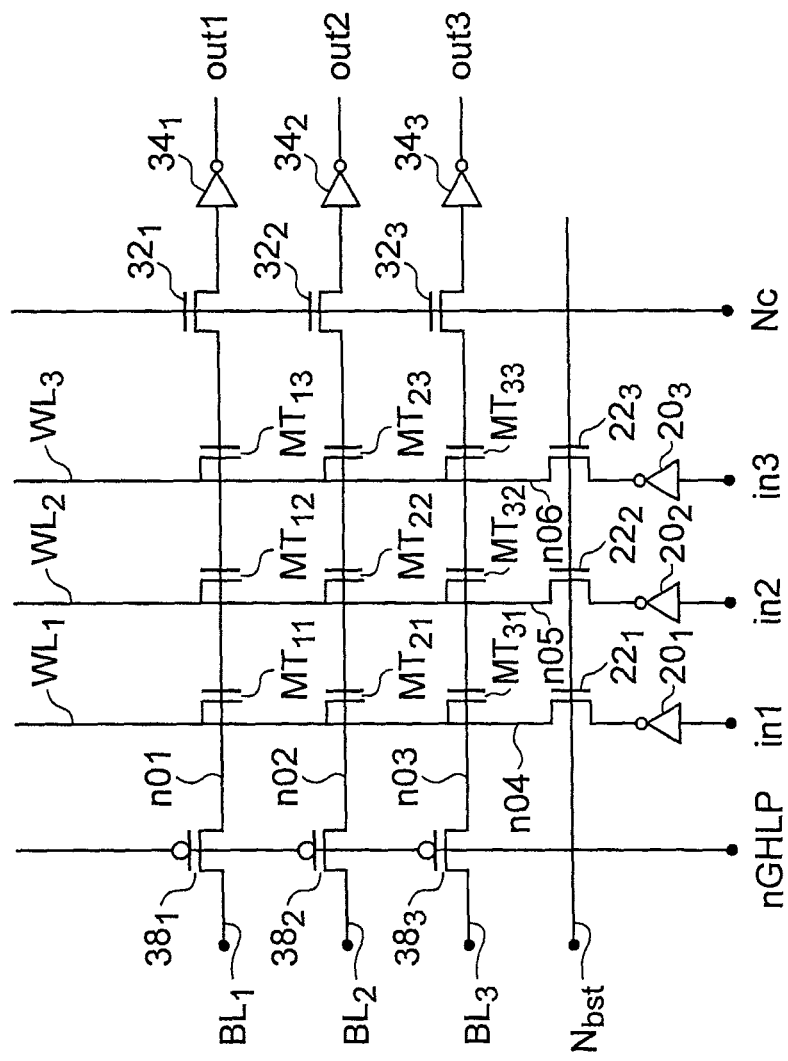
FIG. 22 is a circuit diagram showing an example of a programmable logic circuit according to an eighth embodiment.

FIG. 22 shows a programmable logic circuit according to an eighth embodiment. The programmable logic circuit according to the eighth embodiment includes memory transistors $MT_{11}$-$MT_{33}$ to serve as programmable devices arranged in a 3×3 matrix with rows and columns. Each memory transistor $MT_{ij}$ (i=1, 2, 3, j=1, 2, 3) is, for example, a MOS transistor, in which the gate insulating film may be to be broken down.

The gates of the memory transistors $MT_{11}$, $MT_{12}$, $MT_{13}$ in the first row are connected to a wiring line n01. The gates of the memory transistors $MT_{21}$, $MT_{22}$, $MT_{23}$ in the second row are connected to a wiring line n02. The gates of the memory transistors $MT_{31}$, $MT_{32}$, $MT_{33}$ in the third row are connected to a wiring line n03.

One of the source and the drain of each of the memory transistors $MT_{11}$, $MT_{21}$, $MT_{31}$ in the first column is connected to a wiring line n04. One of the source and the drain of each of the memory transistors $MT_{12}$, $MT_{22}$, $MT_{32}$ in the second column is connected to a wiring line n05. One of the source and the drain of each of the memory transistors $MT_{13}$, $MT_{23}$, $MT_{33}$ in the third column is connected to a wiring line n06.

Although one of the source and the drain of each memory transistor $MT_{ij}$ is connected to a wiring line in the above case, both of the source and the drain may be connected to the wiring line to perform the same operation.

On terminal of each of the wiring lines n01, n02, n03 is connected to a corresponding one of bit lines $BL_1$, $BL_2$, $BL_3$ via a corresponding one of p-channel MOS transistors $38_1$, $38_2$, $38_3$. The other terminal of each of the wiring lines n01, n02, n03 is connected to the input terminal of a corresponding one of CMOS inverters $34_1$, $34_2$, $34_3$ via a corresponding one of cut-off transistors $32_1$, $32_2$, $32_3$. The breakdown voltage for gate insulating films of the p-channel MOS transistors $38_1$, $38_2$, $38_3$ is equal to or higher than that for the memory transistors $MT_{11}$-$MT_{33}$ and the cut-off transistors $32_1$, $32_2$, $32_3$. The gates of the cut-off transistors $32_1$, $32_2$, $32_3$ are connected to a wiring line Nc. Output terminals of the CMOS inverters $34_1$, $34_2$, $34_3$ are connected to output terminals out1, out2, out3 of the programmable logic circuit, respectively. The gates of the p-channel MOS transistors $38_1$, $38_2$, $38_3$ are connected to a wiring line nGHLP.

One terminal of each of the wiring lines n04, n05, n06 is connected to the output terminal of the corresponding one of the CMOS inverters $20_1$, $20_2$, $20_3$ via the corresponding one of the cut-off transistors $22_1$, $22_2$, $22_3$. The other terminals of the wiring lines n04, n05, n06 are connected to word lines $WL_1$, $WL_2$, $WL_3$, respectively. The gates of the cut-off transistors $22_1$, $22_2$, $22_3$ are connected to a wiring line Nbst. Input terminals of the CMOS inverters $20_1$, $20_2$, $20_3$ are connected to input terminals in1, in2, in3 of the programmable logic circuit, respectively.

(Write Method)

Figure 23:
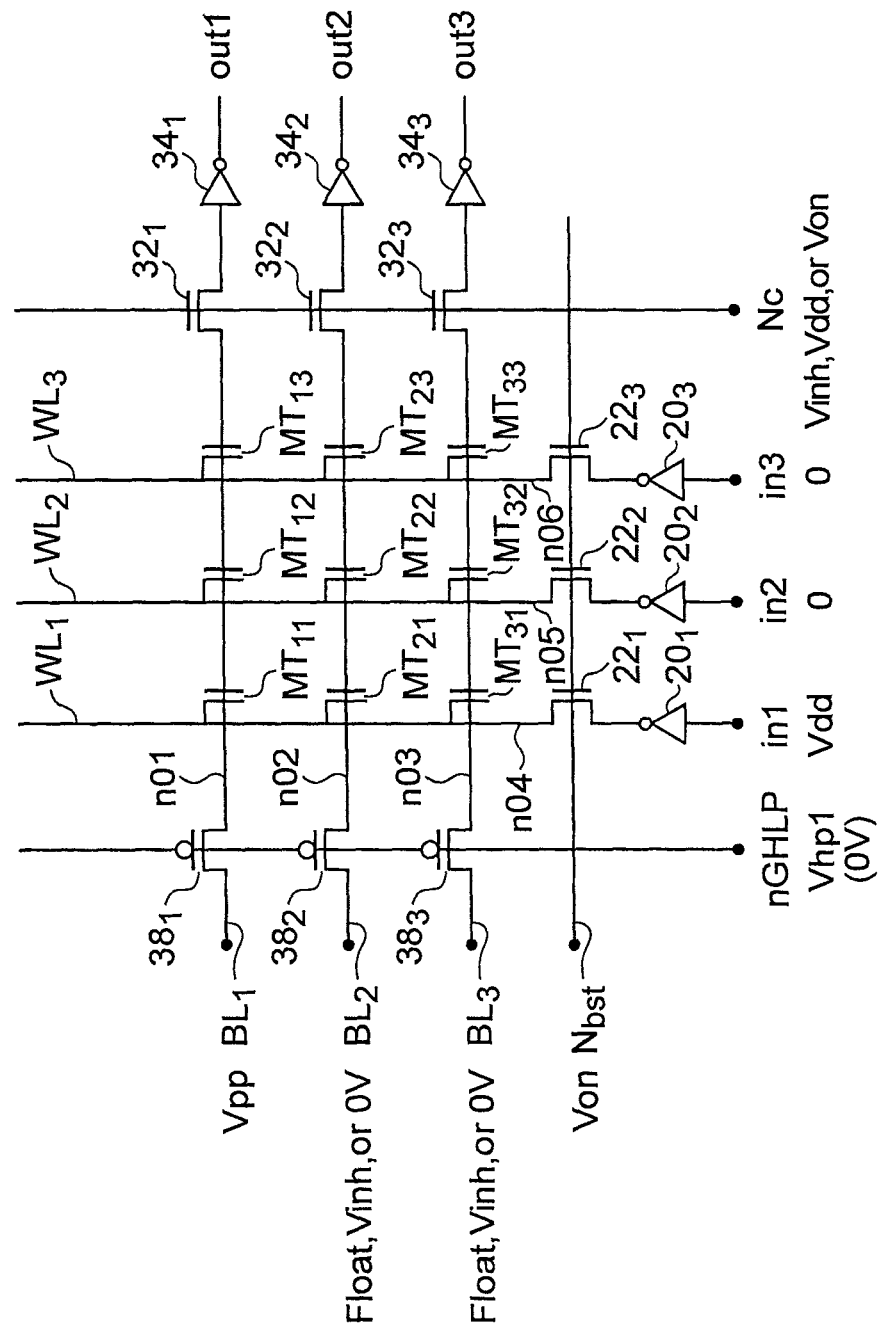
FIG. 23 is an explanatory circuit diagram illustrating a write method of the programmable logic circuit according to the eighth embodiment.

A method of writing data to the programmable logic circuit according to the eighth embodiment will be described with reference to FIG. 23, taking, as an example, an operation for writing data to the memory transistor $MT_{11}$. FIG. 23 shows voltage conditions for writing data to the memory transistor $MT_{11}$.

First, a program voltage Vpp is applied to the bit line $BL_1$ to which the gate of the memory transistor $MT_{11}$ is connected, and a voltage Vhp1 for turning ON the transistors $38_1$, $38_2$, $38_3$ is applied to the wiring line nGHLP to which the gates of the transistor $38_1$, $38_2$, $38_3$ are connected.

If the voltage difference Vpp−Vhp1 is in a level not to break down the gate insulating film of a p-channel MOS transistor, transistors with a breakdown voltage for the gate insulating film similar to that for the memory transistors $MT_{11}$-$MT_{33}$ and the cut-off transistors $32_1$, $32_2$, $32_3$ can be used as the p-channel MOS transistors $38_1$, $38_2$, $38_3$.

An operating voltage Vdd for operating CMOS inverters is applied to the input terminal in1 to set the potential of the wiring line n04 to be 0 V, and a voltage Von is applied to the wiring line Nbst to turn ON the cut-off transistors $22_1$, $22_2$, $22_3$. As a result, a voltage of 0 V is applied to the source and the drain of the memory transistor $MT_{11}$, and the program voltage Vpp is applied to the gate thereof, thereby allowing a write operation to be performed. The operating voltage for the CMOS inverters in a write operation may be a write inhibiting voltage Vinh. In this case, the voltage Vinh is applied to the input terminal in1. The write inhibiting voltage Vinh is between the voltage Vdd and the voltage Vpp, and the voltage difference Vinh-Vss does not break down the memory transistors $MT_{ij}$ and the cut-off transistors $22_j$, $32_i$.

The program voltage Vpp is also applied to the gates of the memory transistors $MT_{12}$, $MT_{13}$. However, the writing to these transistors can be prevented by applying 0 V to the input terminals in2 and in3 so that the potentials of the wiring lines n05 and n06 become the operating voltage Vdd for the CMOS inverters or the voltage Vinh.

The bit lines $BL_2$ and $BL_3$, to which the gates of the memory transistors, on which the write operation is not performed, are brought into a floating state, or the write inhibiting voltage Vinh or the voltage Vss is applied thereto. Thus, the write operation is not performed on these memory transistors, the gates of which are connected to the bit line $BL_2$ or $BL_3$.

The input direction in the programmable logic circuit according to the eighth embodiment is preferably the direction of the wiring line to which one of the source and the drain of each of the memory transistor $MT_{11}$-$MT_{33}$ is connected, for example the direction along which the wiring lines n04, n05, n06 extend, and the output direction is preferably the direction of the wiring line to which the gate of each of the memory transistors $MT_{11}$-$MT_{33}$ is connected, for example the direction along which the wiring lines n01, n02, n03 extend. The reasons for the above is that if the write voltage Vpp is applied to the wiring line (for example n04) to which the source and the drain of a transistor to be programmed (for example $MT_{11}$) is connected, and 0 V is applied to the gate wiring line, a leakage current may flow to the substrates of other memory transistors (for example $MT_{21}$, $MT_{31}$), the sources and the drains of which are connected to the wiring line n04.

(Operation)

Figure 24:
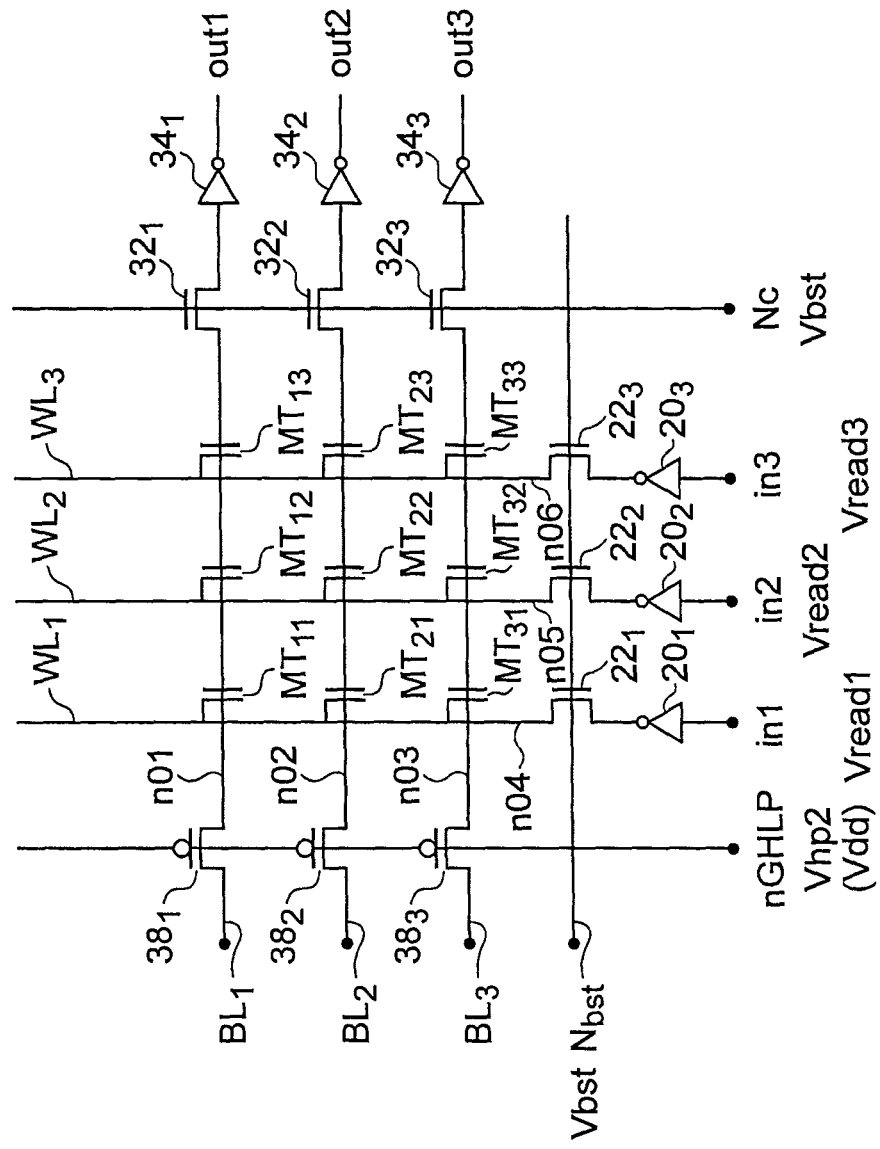
FIG. 24 is an explanatory circuit diagram illustrating an operation method of the programmable logic circuit according to the eighth embodiment.

A method of operating (reading data from) the programmable logic circuit according to the eighth embodiment will be described with reference to FIG. 24. For simplification, a method of reading data from the memory transistor $MT_{11}$ will be described below. FIG. 24 shows voltage conditions to read data from the memory transistor $MT_{11}$.

First, a voltage Vhp2 is applied to the wiring line nGHLP to which the gates of the transistors $38_1$, $38_2$, $38_3$ are connected to turn OFF the transistors $38_1$, $38_2$, $38_3$. This disconnects the bit lines $BL_1$, $BL_2$, $BL_3$ used for the write operation from the memory array including the memory transistors $MT_{11}$-$MT_{33}$. A voltage Vbst for turning ON the cut-off transistors $22_1$-$22_3$, $32_1$-$32_3$ is applied to the wiring line Nbst and the wiring line Nc. This allows a signal Vread1 inputted to the input terminal in1 to be outputted from the output terminal out1 via the memory transistor $MT_{11}$. Unless data has been written to the memory transistors other than the memory transistor $MT_{11}$, signals inputted to the input terminals in2, in3 are not outputted from the output terminals.

According to the eighth embodiment, a voltage for writing data to a memory transistor (programmable device) and not breaking down the gate insulating film of the transistor can be selected as the program voltage Vpp, as in the case of the first embodiment. This allows direct amplification of signals on wiring lines to which the program voltage Vpp is applied, thereby allowing a high speed operation.

As in the case of the sixth embodiment, the programmable logic circuit according to the eighth embodiment may further include transistors, one of the source and the drain of each of which is connected to the gate of the corresponding one of the cut-off transistor $32_1$, $32_2$, $32_3$.

Furthermore, as in the case of the programmable logic circuit shown in FIG. 21, the programmable logic circuit according to the eighth embodiment may further include transistors, one of the source and the drain of each of which is connected to the gate of the corresponding one of the cut-off transistors $22_1$, $22_2$, $22_3$.

Although an example of memory elements arranged in a 3×3 matrix has been described, the number of memory elements may be increased.

(Ninth Embodiment)

Figure 25:
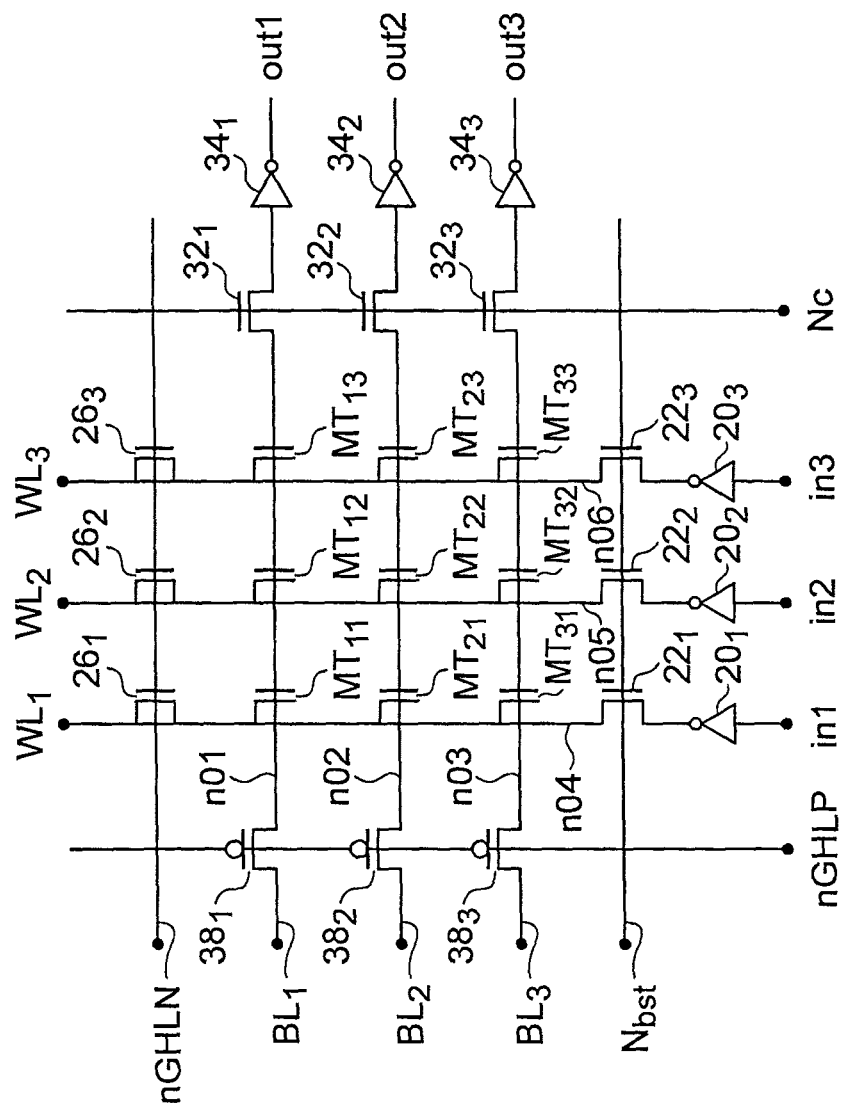
FIG. 25 is a circuit diagram showing an example of a programmable logic circuit according to a ninth embodiment.
Figure 26:
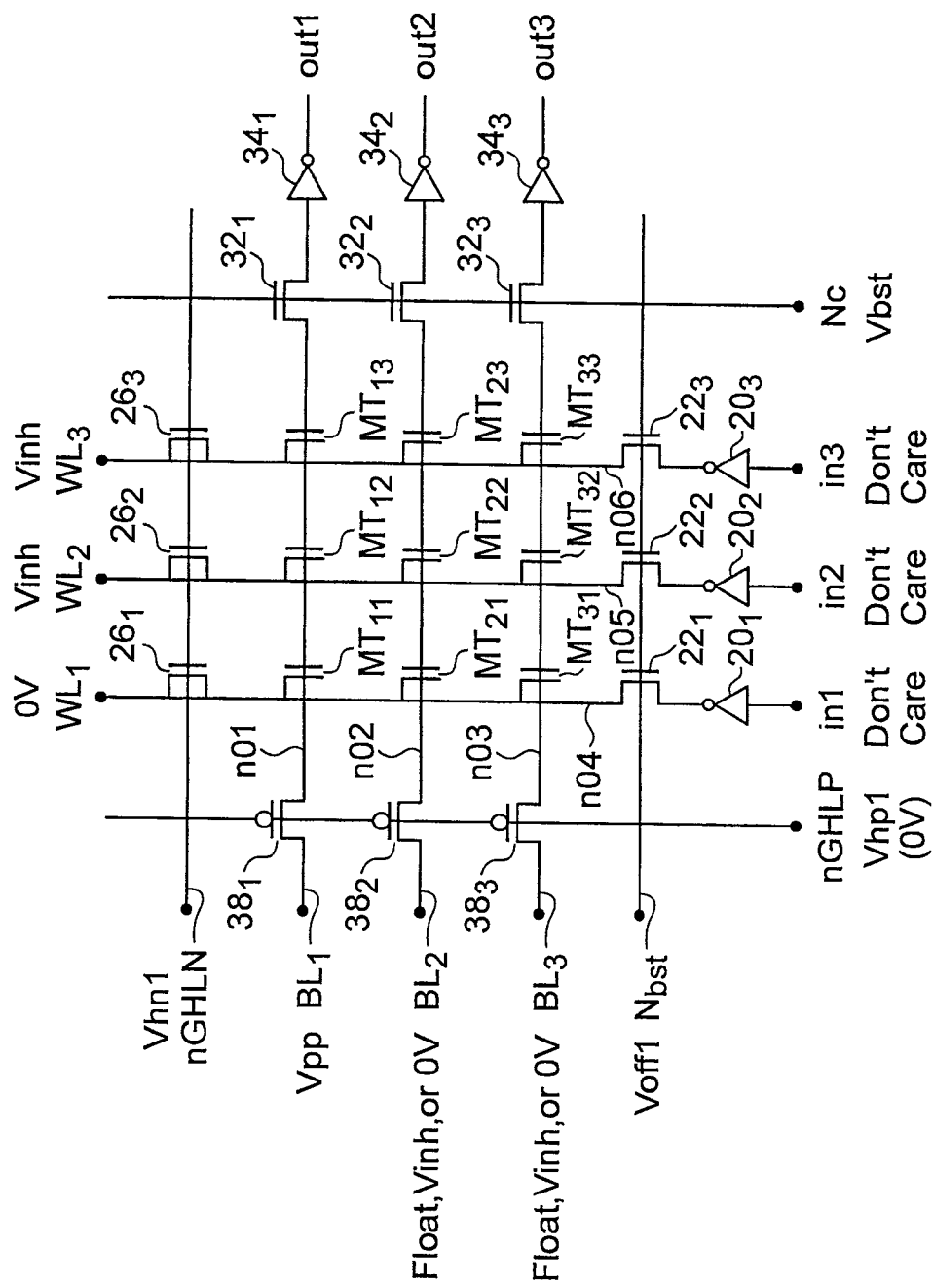
FIG. 26 is an explanatory circuit diagram illustrating a write method of the programmable logic circuit according to the ninth embodiment.
Figure 27:
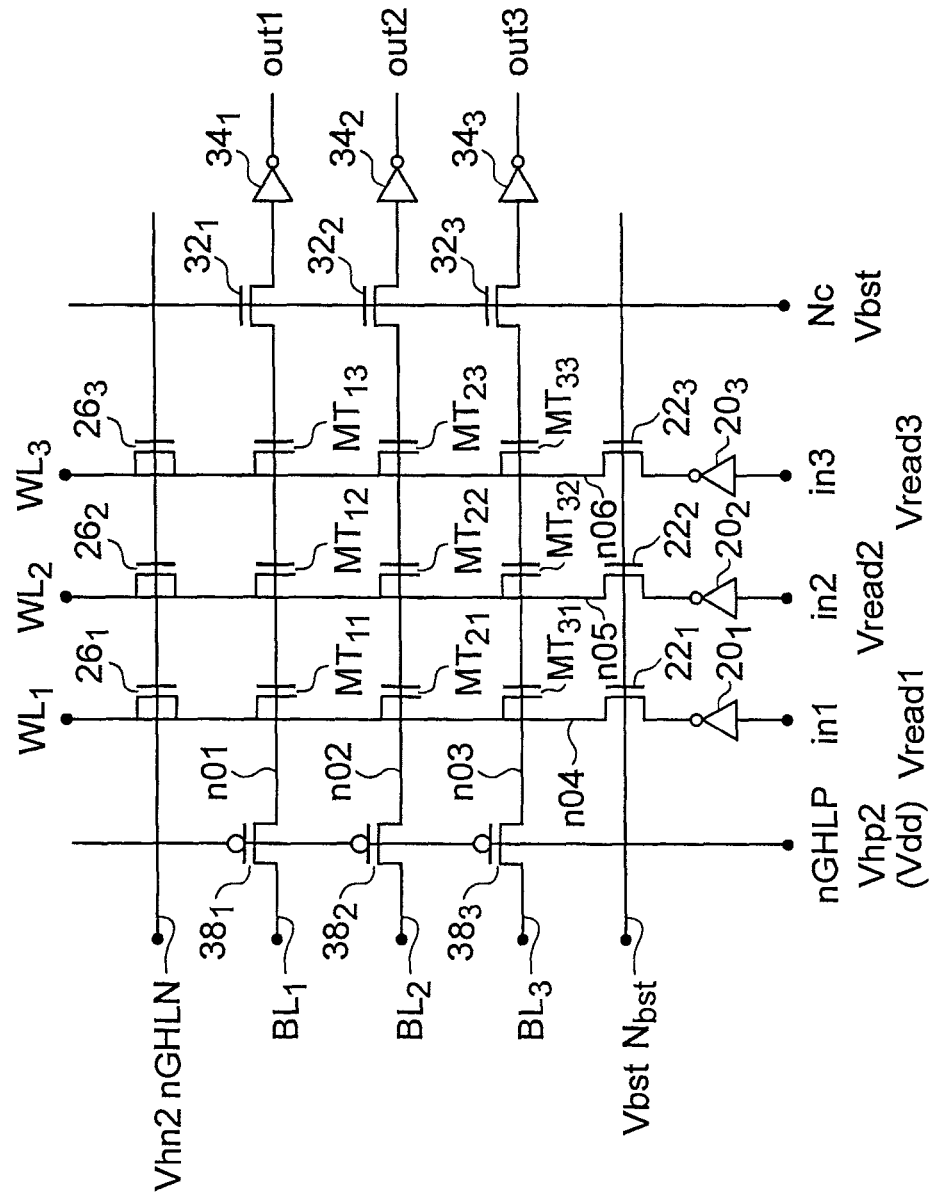
FIG. 27 is an explanatory circuit diagram illustrating an operation method of the programmable logic circuit according to the ninth embodiment.

A programmable logic circuit according to a ninth embodiment will be described with reference to FIGS. 25 to 27. FIG. 25 is a circuit diagram showing a programmable logic circuit according to the ninth embodiment. The programmable logic circuit according to the ninth embodiment is obtained by adding n-channel MOS transistors $26_1$, $26_2$, $26_3$ to respective columns corresponding to the wiring lines n04, n05, n06 of the programmable logic circuit according to the eighth embodiment shown in FIG. 22. The breakdown voltage for gate insulating films of these transistors $26_1$, $26_2$, $26_3$ is higher than or similar to the breakdown voltage for the memory transistors $MT_{11}$-$MT_{33}$ and the cut-off transistors $32_1$, $32_2$, $32_3$. One of the source and the drain of each of the transistors $26_1$, $26_2$, $26_3$ is connected to the corresponding one of the wiring lines n04, n05, n06, the other is connected to the corresponding one of the word lines WL1, WL2, WL3, and the gate is connected to a wiring line nGHLN.

In the programmable logic circuit according to the eighth embodiment, a high voltage is applied to the gate of a memory transistor to which data is to be written to cause breakdown of the gate insulating film thereof. The potential of the word line (for example, the word line $WL_1$) to which the memory transistor (for example, the memory transistor $MT_{11}$) to which data is written should be reduced immediately in order to prevent the breakdown of the gate insulating films of other memory transistors (for example, memory transistors $MT_{21}$, $MT_{31}$), one of the source and the drain of each of which is connected to the same wiring line as that of the memory transistor to which data is written (for example, memory transistor $MT_{11}$). In order to reduce the potential, the size of the input inverters $20_1$, $20_2$, $20_3$ is increased in the eighth embodiment to draw current rapidly. In order to increase the size of the inverters, however, the size of the n-channel MOS transistors and the p-channel MOS transistors should also be increased.

The n-channel MOS transistors $26_1$, $26_2$, $26_3$ connected to the wiring lines n04, n05, n06 in the ninth embodiment are intended to allow the input inverters $20_1$, $20_2$, $20_3$ to maintain the speed required for reading signals, and to reduce the size and the power consumption in operation.

(Write Method)

A method of writing data to the programmable logic circuit according to the ninth embodiment will be described with reference to FIG. 26. FIG. 26 shows voltage conditions for writing data to the memory transistor $MT_{11}$.

First, a program voltage Vpp is applied to the bit line $BL_1$ to which the gate of the memory transistor $MT_{11}$ is connected, and a voltage Vhp1 is applied to the wiring line nGHLP to which the gates of the p-channel MOS transistors $38_1$, $38_2$, $38_3$ are connected to turn ON the transistors $38_1$, $38_2$, $38_3$. A voltage of 0 V is applied to the word line $WL_1$ to set the potential of the wiring line n04 to be 0 V, and a voltage Vhn1 is applied to the wiring line nGHLN to turn ON the transistors $26_1$, $26_2$, $26_3$. This applies the voltage 0 V to the source and the drain of the memory transistor $MT_{11}$, and the program voltage Vpp to the gate thereof to allow a write operation to be performed.

If the voltage difference Vpp−Vhn1 would not break down the gate insulating films of n-channel MOS transistors, transistors with about the same breakdown voltage for gate insulating films as that of the memory transistors $MT_{11}$-$MT_{33}$ and the cut-off transistors $32_1$, $32_2$, $32_3$ can be used as the n-channel MOS transistors $26_1$, $26_2$, $26_3$. Although the program voltage Vpp is also applied to the gates of the memory transistors $MT_{12}$, $MT_{13}$, data would not be written to these transistors if a write inhibiting voltage Vinh is applied to the word line $WL_2$ and the word line $WL_3$.

The cut-off transistors $22_1$, $22_2$, $22_3$ connected to the wiring lines n04, n05, n06 connecting to the transistors $26_1$, $26_2$, $26_3$ are turned OFF to block signals from the input terminals in1, in2, in3. The write operation is not performed on the memory transistors $MT_{21}$-$MT_{33}$, by bringing into a floating state the bit lines $BL_2$, $BL_3$, to which the gates of these memory transistors $MT_{21}$-$MT_{33}$ are connected, or a write inhibiting voltage Vinh or a voltage Vss is applied to the bit lines $BL_2$, $BL_3$.

(Operation)

A method of operating (reading data from) the programmable logic circuit according to the ninth embodiment will be described with reference to FIG. 27. FIG. 27 shows voltage conditions for reading data from the memory transistors $MT_{11}$ after writing data to the memory transistor $MT_{11}$.

First, a voltage Vhp2 is applied to the wiring line nGHLP to which the gates of the transistors $38_1$, $38_2$, $38_3$ are connected to turn OFF the transistors $38_1$, $38_2$, $38_3$. As a result, the bit lines $BL_1$-$BL_3$ used for the write operation are disconnected from the memory array. Similarly, a voltage Vhn2 is applied to the transistors $26_1$-$26_3$ to turn OFF these transistors. As a result, the word lines $WL_1$-$WL_3$ used for the write operation are disconnected from the memory array.

A voltage Vbst is applied to the wiring lines Nbst, Nc to turn ON the cut-off transistors $22_1$-$22_3$, $32_1$-$32_3$. As a result, a signal Vread1 inputted to the input terminal in1 passes through the memory transistor $MT_{11}$ and is outputted from the output terminal out1. Input signals to the input terminals in2, in3 are not outputted from the output terminals out2, out3 unless the memory transistors $MT_{21}$, $MT_{31}$ are programmed.

Figure 28:
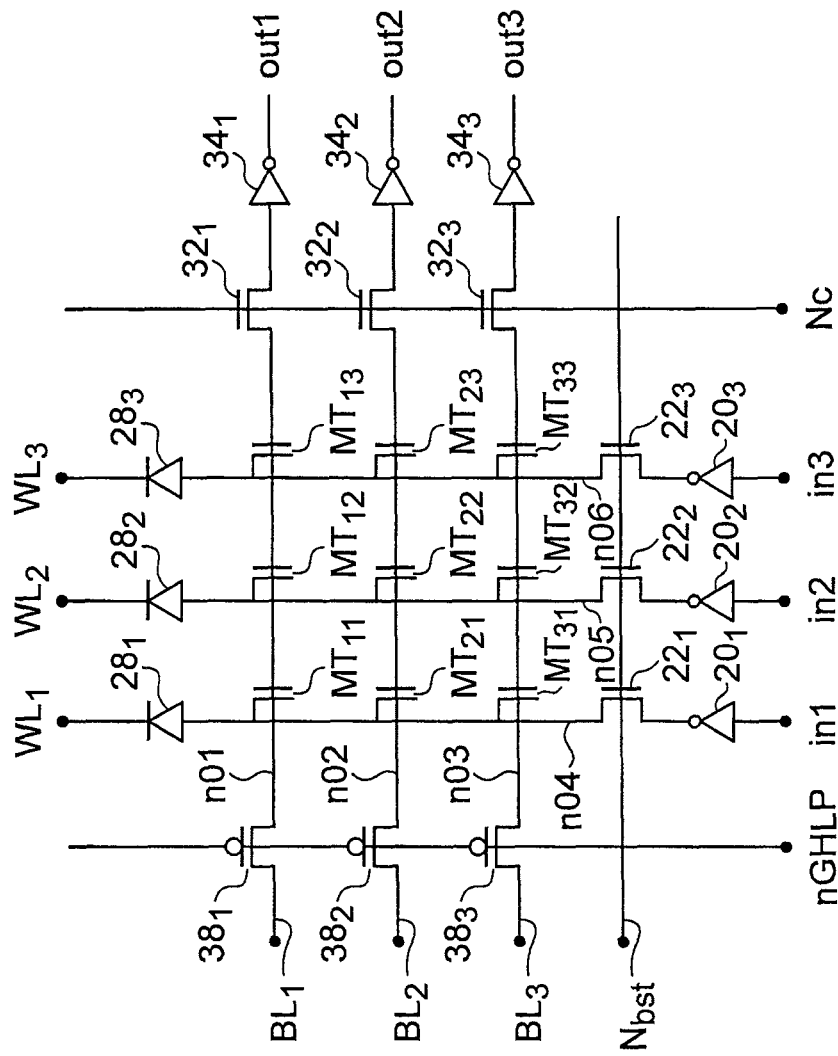
FIG. 28 is a circuit diagram showing an example of a programmable logic circuit according to a modification of the ninth embodiment.

Diodes $28_1$, $28_2$, $28_3$ may replace the transistors $26_1$, $26_2$, $26_3$ as shown in FIG. 28.

According to the ninth embodiment, a voltage for writing data to a memory transistor (programmable device) and not breaking down the gate insulating film of a transistor can be selected as the program voltage Vpp as in the case of the first embodiment. This allows direct amplification of signals on wiring lines to which the program voltage Vpp is applied, thereby allowing a high speed operation.

As in the case of the sixth embodiment, the programmable logic circuit according to the ninth embodiment may further include transistors, one of the source and the drain of each of which is connected to the gate of the corresponding one of the cut-off transistors $32_1$, $32_2$, $32_3$.

Furthermore, as in the case of the programmable logic circuit shown in FIG. 21, the programmable logic circuit according to the ninth embodiment may further include transistors, one of the source and the drain of each of which is connected to the gate of the corresponding one of the cut-off transistors $22_1$, $22_2$, $22_3$.

Figure 29:
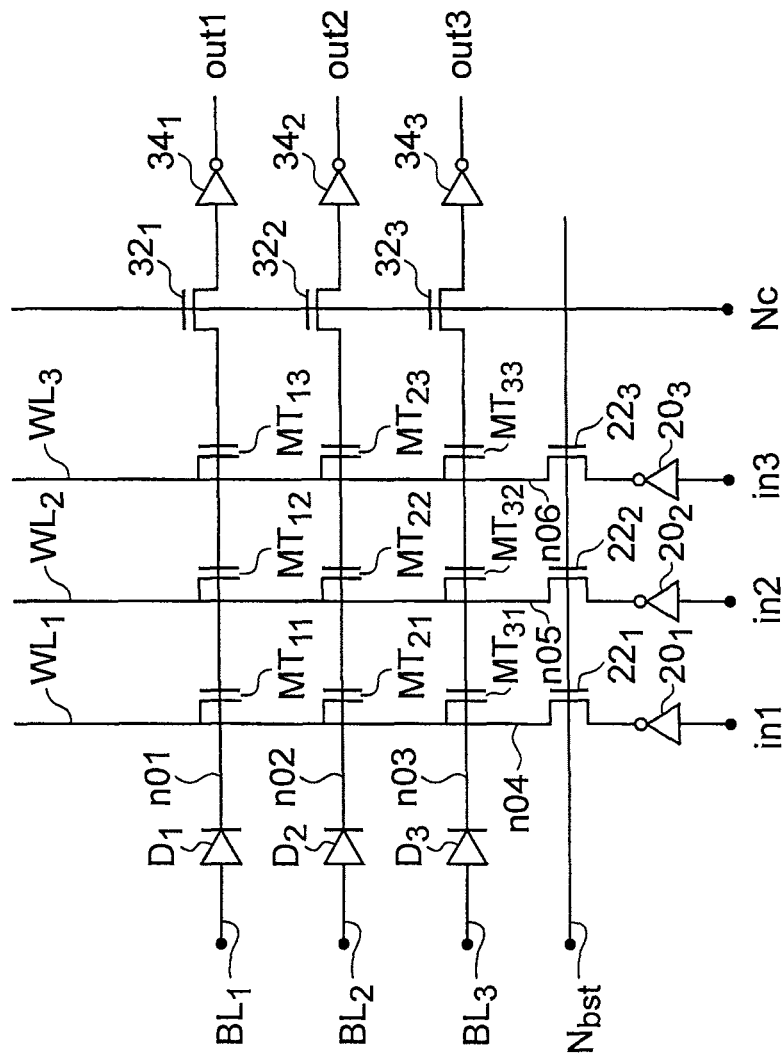
FIG. 29 is a circuit diagram of a programmable logic circuit according to a modification of the eighth embodiment.

The p-channel MOS transistors $38_1$, $38_2$, $38_3$ of the eighth embodiment and the ninth embodiment may be replaced with n-channel MOS transistors or diodes $D_1$, $D_2$, $D_3$. In the case of n-channel MOS transistors, the gate voltage for n-channel MOS transistors in write operation is higher than program voltage Vpp by the threshold voltage of n-channel MOS transistor. FIG. 29 shows an example of a programmable logic circuit in which the p-channel MOS transistors $38_1$, $38_2$, $38_3$ are replaced with diodes $D_1$, $D_2$, $D_3$ in the programmable logic circuit according to the eighth embodiment shown in FIG. 22. The replacement of the p-channel MOS transistors with the n-channel MOS transistors or the diodes has an effect of reducing area.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A programmable logic circuit comprising:
a plurality of first wiring lines;
a plurality of second wiring lines intersecting with the first wiring lines in intersecting areas;
a plurality of cells disposed in the intersecting areas, at least one of the cells including a programmable device with a first terminal and a second terminal, the first terminal of the programmable device being connected to one of the first wiring lines, and the second terminal being connected to one of the second wiring lines;
a plurality of first cut-off transistors each including a source and a drain, one of the source and the drain being connected to the one of the second wiring lines; and
a plurality of first CMOS inverters each corresponding to one of the first cut-off transistors, each of the first CMOS inverters including an input terminal, the input terminal being connected to the other of the source and the drain of the corresponding one of the first cut-off transistors,
wherein at most one of the programmable devices connected to one of the second wiring lines is programmed.

2. The circuit according to claim 1, wherein if the programmable device is to be programmed, a drive voltage Vdd is applied to a gate of one of the first cut-off transistors.

3. The circuit according to claim 2, wherein a voltage Vpp used to program the programmable device is in a range $$Vdd < Vpp < 2.0 \times 10^9 \times Tox + Vdd$$

where Tox is a thickness of a gate insulating film of each of the first cut-off transistors.

4. The circuit according to claim 1, wherein the programmable device is a MOS transistor, one of the first terminal and the second terminal of the programmable device is a gate of the MOS transistor, and the other is at least one of a source and a drain of the MOS transistor.

5. The circuit according to claim 1, wherein the programmable device is a resistive change memory including a first electrode, a second electrode, and a resistive change layer disposed between the first electrode and the second electrode.

6. The circuit according to claim 1, further comprising:
a plurality of first transistors corresponding to the first cut-off transistors, each of the first transistors including a source and a drain, one of the source and the drain being connected to a gate of the corresponding one of the first cut-off transistors;
a third wiring line to which the other of the source and the drain of each first transistor is connected; and
a fourth wiring line to which a gate of each first transistor is connected.

7. The circuit according to claim 1, further comprising:
a plurality of diodes each corresponding to one of the first cut-off transistors, a cathode of each diode being connected to a gate of the corresponding one of the first cut-off transistors; and
a third wiring line to which an anode of each diode is connected.

8. The circuit according to claim 1, further comprising second CMOS inverters each corresponding to one of the first wiring lines to drive the corresponding one of the first wiring lines.

9. The circuit according to claim 8, further comprising a plurality of second cut-off transistors each connected between an output of a corresponding one of the second CMOS inverters and a corresponding one of the first wiring lines.

10. The circuit according to claim 9, further comprising a plurality of second transistors each corresponding to one of the second wiring lines, one of a source and a drain of each second transistor being connected to the corresponding one of the second wiring lines on an opposite side to the first cut-off transistor connected to the corresponding one of the second wiring lines.

11. The circuit according to claim 10, further comprising a plurality of third transistors each corresponding to one of the first wiring lines, one of a source and a drain of each third transistor being connected to the corresponding one of the first wiring lines on an opposite side to the second cut-off transistor connected to the corresponding one of the first wiring lines.

12. A nonvolatile FPGA comprising a plurality of unit blocks, at least one of the unit blocks including:
a logic block that performs a logical operation; and
a switching block that controls connection and disconnection between adjacent ones among the unit blocks and controls connection and disconnection with the logic block,
at least one of the logic block and the switching block including the programmable logic circuit according to claim 1.

13. A programmable logic circuit comprising:
a plurality of first wiring lines;
a plurality of second wiring lines intersecting with the first wiring lines in intersecting areas;
a plurality of cells disposed in the intersecting areas, at least one of the cells including a programmable device with a first terminal and a second terminal, the first terminal of the programmable device being connected to one of the first wiring lines, and the second terminal being connected to one of the second wiring lines;
a plurality of first cut-off transistors each including a source and a drain, one of the source and the drain being connected to the one of the second wiring lines;
a plurality of first CMOS inverters each corresponding to one of the first cut-off transistors, each of the first CMOS inverters including an input terminal, the input terminal being connected to the other of the source and the drain of the corresponding one of the first cut-off transistors; and
a plurality of first transistors each corresponding to one of the second wiring lines, one of a source and a drain of each first transistor being connected to the corresponding one of the second wiring lines on an opposite side to the first cut-off transistor connected to the corresponding one of the second wiring lines.

14. The circuit according to claim 13, wherein the programmable device is a MOS transistor, one of the first terminal and the second terminal of the programmable device is a gate of the MOS transistor, and the other is at least one of a source and a drain of the MOS transistor.

15. The circuit according to claim 13, wherein the first transistors are p-channel MOS transistors.

16. The circuit according to claim 13, further comprising second CMOS inverters each corresponding to one of the first wiring lines to drive the corresponding one of the first wiring lines.

17. A programmable logic circuit comprising:
a plurality of first wiring lines;
a plurality of second wiring lines intersecting with the first wiring lines in intersecting areas;
a plurality of cells disposed in the intersecting areas, at least one of the cells including a programmable device with a first terminal and a second terminal, the first terminal of the programmable device being connected to one of the first wiring lines, and the second terminal being connected to one of the second wiring lines;
a plurality of first cut-off transistors each including a source and a drain, one of the source and the drain being connected to the one of the second wiring lines;
a plurality of first CMOS inverters each corresponding to one of the first cut-off transistors, each of the first CMOS inverters including an input terminal, the input terminal being connected to the other of the source and the drain of the corresponding one of the first cut-off transistors; and
a plurality of first transistors each corresponding to one of the first wiring lines, one of a source and a drain of each first transistor being connected to the corresponding one of the first wiring lines.

18. The circuit according to claim 17, wherein the programmable device is a MOS transistor, one of the first terminal and the second terminal of the programmable device is a gate of the MOS transistor, and the other is at least one of a source and a drain of the MOS transistor.

19. The circuit according to claim 17, wherein the first transistors are n-channel MOS transistors.

20. The circuit according to claim 17, further comprising second CMOS inverters each corresponding to one of the first wiring ones to drive the corresponding one of the first wiring lines.

* * * * *